(12) United States Patent
Ikeuchi

(10) Patent No.: US 6,952,818 B2
(45) Date of Patent: Oct. 4, 2005

(54) METHOD AND SYSTEM FOR OPTICAL PROXIMITY CORRECTION

(75) Inventor: Atsuhiko Ikeuchi, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 133 days.

(21) Appl. No.: 10/304,895

(22) Filed: Nov. 26, 2002

(65) Prior Publication Data
US 2003/0115569 A1 Jun. 19, 2003

(30) Foreign Application Priority Data

Nov. 26, 2001 (JP) .................................. P2001-359956

(51) Int. Cl.[7] .............................................. G06F 17/50
(52) U.S. Cl. ........................................... 716/21; 716/19
(58) Field of Search ............................ 716/19–21, 1–3; 430/5, 30

(56) References Cited

U.S. PATENT DOCUMENTS 6,077,310 A * 6/2000 Yamamoto et al. ............ 716/19
6,584,609 B1 * 6/2003 Pierrat et al. .................. 716/19
6,622,297 B2 * 9/2003 Uno et al. ..................... 716/21
2002/0007481 A1 * 1/2002 Ono .............................. 716/21
2002/0040468 A1 * 4/2002 Uno et al. ..................... 716/19

FOREIGN PATENT DOCUMENTS

JP    2000-260879    9/2000
JP    2000-314954    11/2000

* cited by examiner

Primary Examiner—Matthew Smith
Assistant Examiner—Binh Tat
(74) Attorney, Agent, or Firm—Brenda O. Holmes; Kilpatrick Stockton LLP

(57) ABSTRACT

A computer implemented method for OPC includes: storing an improper OPC pattern and a corrective treatment for the improper OPC pattern in a library storage medium; reading a layout pattern; and matching the layout pattern with the improper OPC pattern stored in the library storage medium.

20 Claims, 20 Drawing Sheets

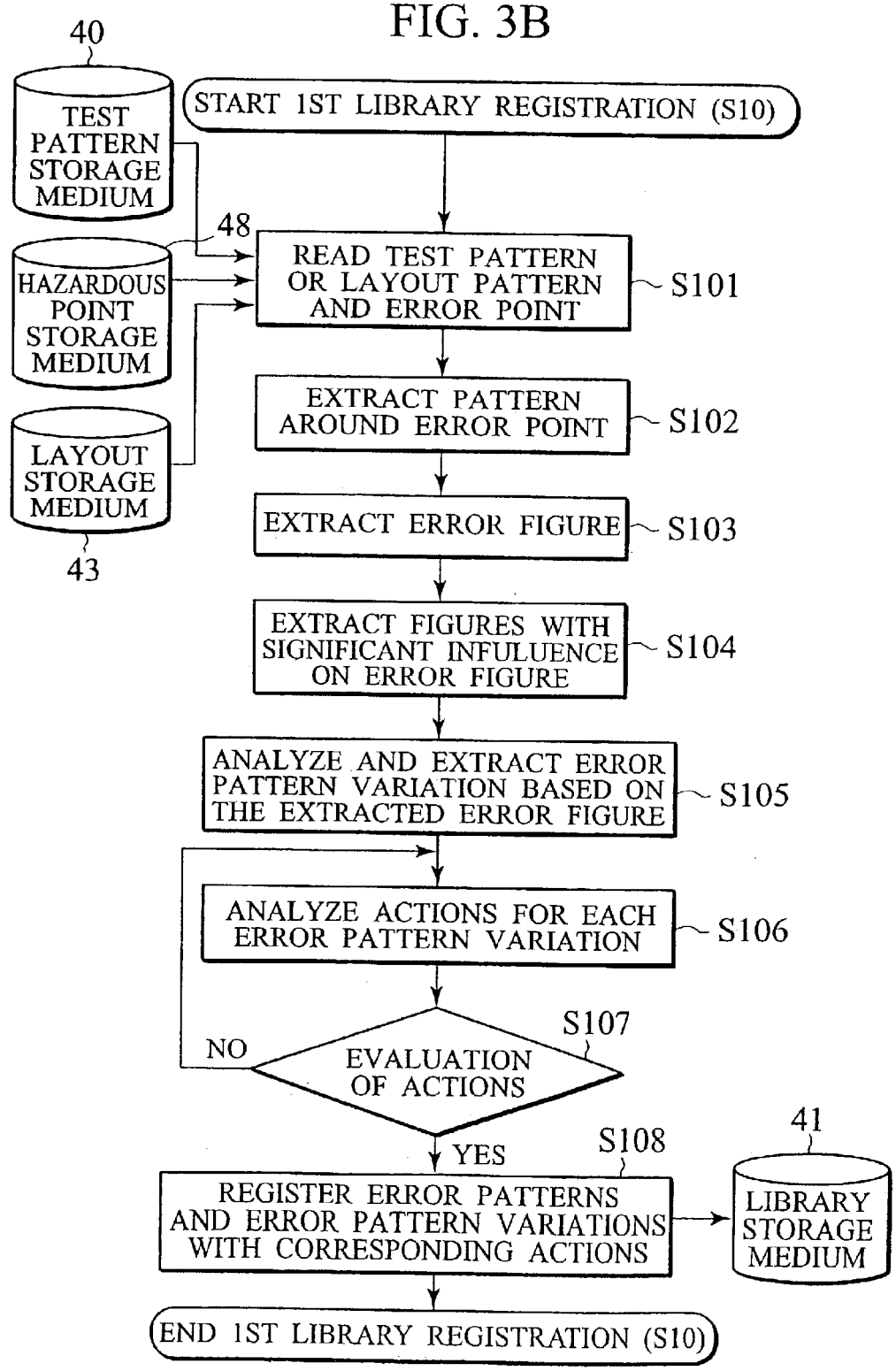

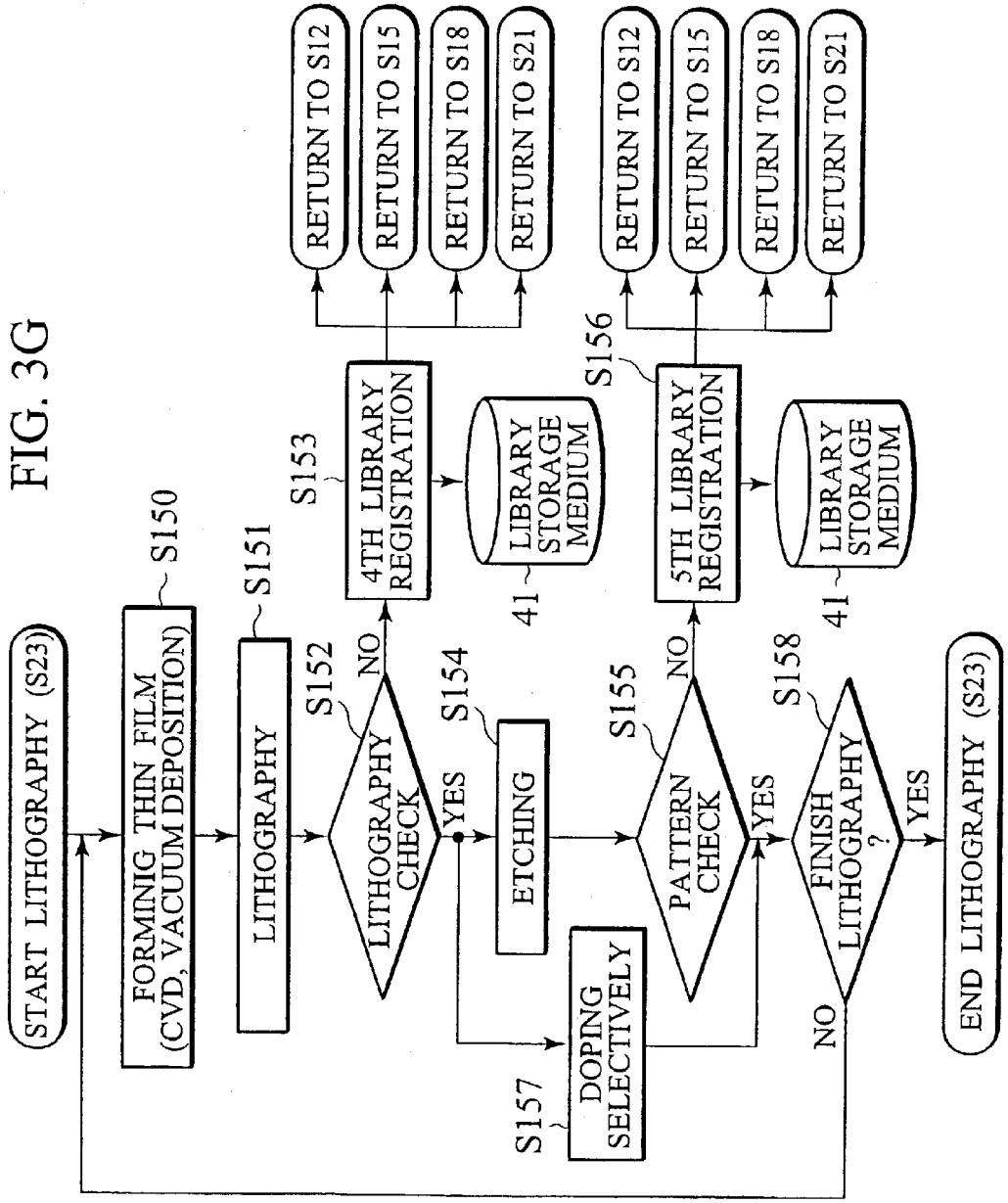

77a

77b

METHOD AND SYSTEM FOR OPTICAL PROXIMITY CORRECTION

CROSS REFERENCE TO RELATED APPLICATIONS

This application is abased upon and claims the benefit of priority from prior Japanese Patent Application P2001-359956 filed on Nov. 26, 2001; the entire contents of which are incorporated by reference herein.

BACKGROUND OF THE INVENTION

1. Field of the Invention

The present invention relates to methods and systems for optical proximity correction (hereinafter referred to as "OPC") for layout design and verification processing of mask data for semiconductor integrated circuits.

2. Description of the Related Art

With the miniaturization of semiconductor integrated circuits in recent years, it has become difficult to generate precise minute mask patterns on a wafer through optical exposure. As a result, in order to generate minute mask patterns, certain graphics are added on the mask pattern in advance, or OPC is conducted which corrects the dimension of the pattern depending on the density of the pattern. OPC can be grouped into two categories: rule-based OPC and model-based OPC. The "rule-based OPC" is a method wherein a correlation table between the distortion and the proximity effect is prepared for each line width and space, based on the actual measurement obtained from the pattern transferred by an OPC test, in order to establish rules for correcting the layout patterns. The correction is conducted according to those rules. That is, the rule-based OPC is a method to generate OPC patterns based on the OPC pattern generation rules specified for each pattern category of the circuit patterns. The rule-based OPC is effective when adjacent figures are checked in one-dimension for correction, such as line and space patterns. On the other hand, the "model-based OPC" is a correction which uses lithography simulation-based models. According to the "model-based OPC", a model is calibrated based on the actual measurement obtained from the transferred pattern in order to handle more complicated processes. That is, according to the model-based OPC method, a model equation simulating a dimension expected to be obtained after processing is used to calculate the dimension of the post-process mask pattern to make it match the dimension of the design pattern. This model-based OPC is effective when adjacent figures are checked in two-dimensions for correction. The model-based OPC takes much more processing time than the rule-based OPC, but has higher accuracy for corrections in general. The leading edge devices of recent years require two-dimensional OPC, thus, the model-based OPC, which can be realized comparatively easily, is employed. Also, an approach combining the rule-based OPC and the model-based OPC is also implemented.

However, after the process has been conducted for numerous processing generations, an increasing number of patterns cannot be corrected properly, and a more accurate OPC becomes necessary. Unfortunately, the model-based OPC fails to solve this problem in practice, because it is difficult for the model-based OPC to correct all patterns by a calibration based on actual measurements, in terms of the time necessary for the actual measurement and the enormous amount of data. In order to mitigate the above problem, the following methods are employed:

1) when there is any region which requires different accuracy, a model is specifically designed for that region and applied to the intended region accordingly, and 2) when accuracy can be improved by designing a model (rule) specifically for each process such as mask production, lithography upon the wafer, and wafer processing after the lithography such as etching (for example, the proximity effect in the etching process may be different from that in other processes), different models (rules) are designed for each process to conduct correction specific to that process.

In the conventional OPC processing, it takes a lot of time for the lithography simulation to obtain a transferred image, and it also takes a lot of time and many processes to analyze the pattern which is output as a hazardous part and to determine an appropriate corrective treatment, which prolongs the verification time. In addition, a flow in which the lithography rule check, after the OPC is conducted for each region (logic part, peripheral memory part, side of memory cell) and each process (etching process, lithography process, mask production process), and detailed simulation of the transferred image is conducted, must be repeated many times, which significantly prolongs the manufacturing time of a semiconductor integrated circuit. In addition, conventionally, each time a nonconformance pattern is discovered in a process or a region, the process must return to the very beginning of the work-flow to correct the OPC setting or the layout design, which also adds time to the overall manufacturing process. Furthermore, although efforts are made to improve accuracy by adjusting the OPC setting based on the result of the OPC verification, accuracy may be degraded by any side effects on other patterns, which makes the optimization of OPC processing difficult.

As shown in FIG. 1A, the edges to be corrected by the OPC can be grouped into a line edge 80a, a line section 80b, an inner corner 80c, and an outer corner 80d, for example. To begin with as shown in FIG. 1B, suppose a correction using a rule or a model without a restriction (or a default rule or model) is made on the part where the line edge 83a in the pattern 81 and the outer corner 84a in the pattern 82 are close. In this case, the space between the FIGS. 81 and 82 is narrowed due to the existence of the correction parts 83b and 84b as shown in FIG. 1C, which may lead to a short-circuit between the FIGS. 81 and 82 after transfer. Therefore, in the OPC processing, a restrictive value must be set to guarantee appropriate minimum space between the line edge 83c and the outer corner 84c, in order to avoid short-circuiting, as shown in FIG. 1D.

A corrective treatment specially used for each pattern type can be designed by setting detailed corrections for each type of edges 80a, 80b, 80c, and 80d in FIG. 1A. In practice, however, it is difficult to apply such specific corrective treatments flexibly to a new pattern variation. For example, as shown in FIG. 1D, a correction may need different limit values for different cases, depending on the region surrounding the pattern and differences in the line width of the patterns.

Furthermore, if optimal OPC is conducted for each section on the chip including a logic section, and a memory section (the inside of the memory cell, the edge of the memory cell, and the periphery of the memory cell) in a memory integrated chip, or for each process including the reticle production process, wafer lithography process, or etching process, the accuracy is only improved on average. Some patterns may not be corrected appropriately, so that a corrective treatment specifically designed for each pattern becomes necessary. The memory section is further divided into the inside of the memory cell, the edge of the memory cell and the periphery of the memory cell, each of which needs a different OPC.

As described, the conventional method fails to complete OPC in a short period of time, and does not conduct appropriate correction on every variation of the patterns.

SUMMARY OF THE INVENTION

A computer implemented method for OPC includes: storing an improper OPC pattern and a corrective treatment for the improper OPC pattern in a library storage medium; reading a layout pattern; and matching the layout pattern with the improper OPC pattern stored in the library storage medium.

An system for OPC includes: a library storage medium; a library registration unit configured to store an improper OPC pattern and a corrective treatment for the improper OPC pattern in the library storage medium; a layout pattern obtained from at least one of a layout unit, an OPC unit, or an OPC verification unit; and a pattern matching unit configured to match the layout pattern with the improper OPC pattern stored in the library storage medium.

A computer program product for use with an optical proximity correction system, the system including a CPU and a library storage medium connected to the CPU, the computer program product includes: instructions configured to store an improper OPC pattern and a corrective treatment for the improper OPC pattern in a library storage medium; instructions configured to read a layout pattern; and instructions configured to match the layout pattern with the improper OPC pattern stored in the library storage medium.

BRIEF DESCRIPTION OF THE DRAWINGS

FIG. 3B is a flow chart illustrating the first library registration process in step S10 of FIG. 3A.

FIG. 3G is a flow chart illustrating the lithography process in step S 23 of FIG. 3A.

DETAILED DESCRIPTION OF THE EMBODIMENTS

Figure 1A:
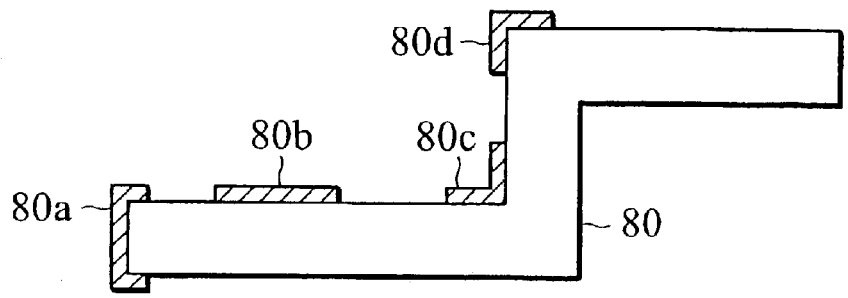
FIG. 1A is a diagram illustrating an exemplary classification of the edges of a layout pattern to be corrected.
Figure 1B:
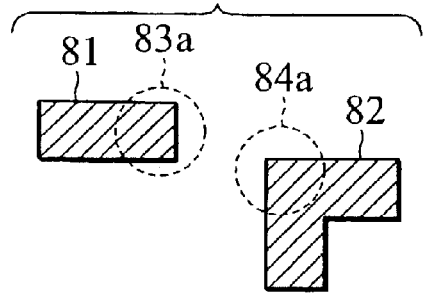
FIG. 1B is a diagram illustrating a pattern before OPC.
Figure 1C:
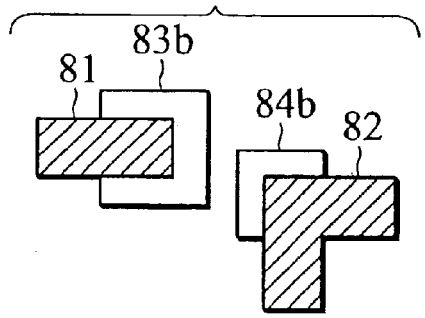
FIG. 1C is a diagram illustrating a pattern after OPC.
Figure 1D:
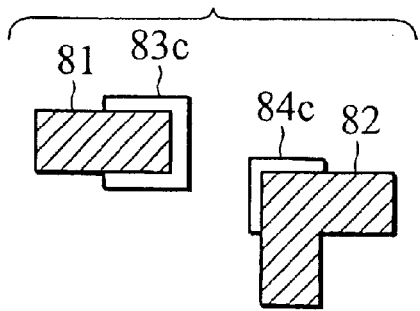
FIG. 1D is a diagram illustrating an OPC applied pattern that is corrected before applying OPC.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set fourth such as specific signal values, etc. to provide a thorough understanding of the present invention. However, it will be obvious to those skilled in the art that the present invention may be practiced without such specific details in other instances, well-known circuits have been shown in block diagram generate in order not to obscure the present invention in unnecessary detail. In the following description of the embodiments, an optical proximity correction (OPC) system, which can speed up the OPC process to verify the validity of the post-OPC pattern, and an OPC method using the OPC system, are described.

System Architecture

Figure 2A:
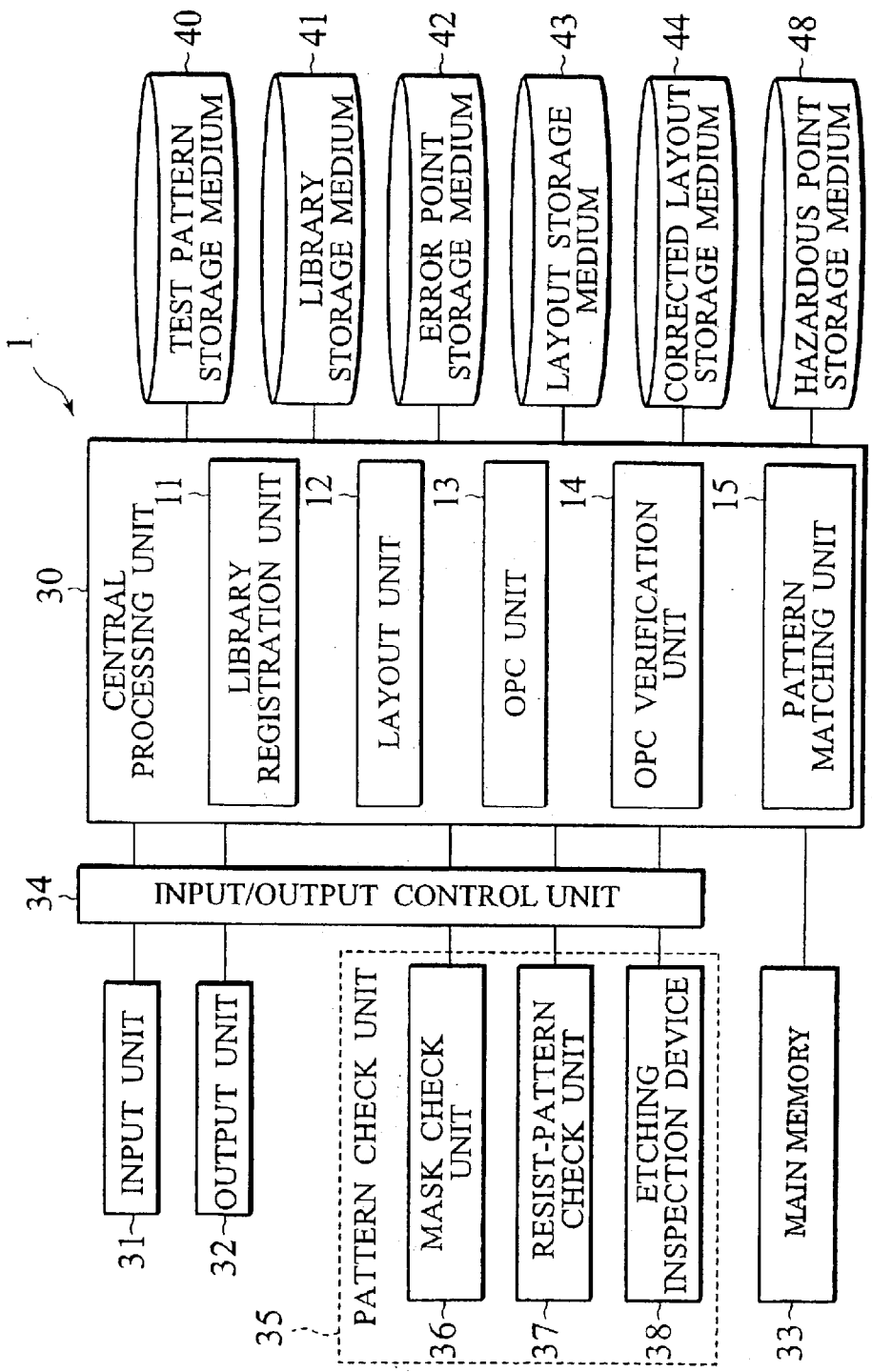
FIG. 2A is a block diagram illustrating an OPC system according to the present invention.

As shown in FIG. 2A, a OPC verification system 1 according to the present invention includes at least, a central processing unit (CPU) 30, an input-output control unit 34, a main memory 33, a test patterns storage medium 40, a library storage medium 41, an error part storage medium 42, a layout storage medium 43, a post-correction layout storage medium 44, and a hazardous part storage medium 48. The units from 34 to 48 listed above are connected to the CPU 30. The input/output control unit 34 has an input unit 31, an output unit 32 and a pattern check unit 35, all of which are connected to the input/output control unit 34. The pattern check unit 35 includes a mask check unit 36, a resist-pattern check unit 37, and an etching inspection device 38.

The CPU 30 includes at least, a library registration unit 11, a layout unit 12, an OPC unit 13, an OPC verification unit 14, and a pattern matching unit 15. Although not shown in the figure, the CPU 30 further includes various units, one of which is a database management unit. For example, when input/output is necessary for one of the following devices: the test pattern storage medium 40, the library storage medium 41, the error part storage medium 42, the layout storage medium 43, the post-correction layout storage medium 44 or the hazardous part storage medium 48, the location where the necessary file is stored is searched, and the file once retrieved is read out/written in via the database management unit.

Figure 2B:
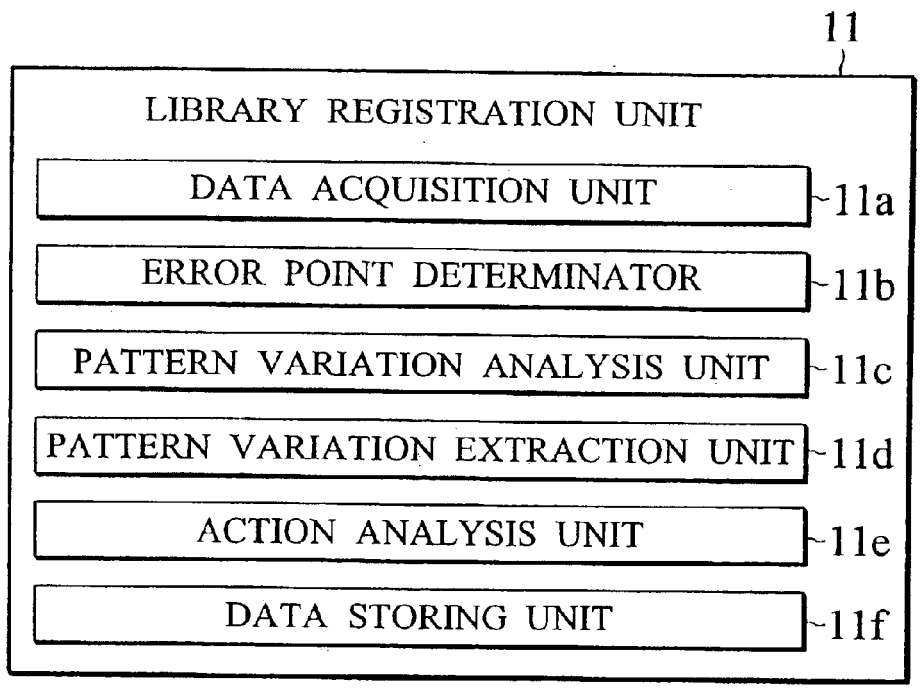
FIG. 2B is a block diagram illustrating a library registration unit of the OPC system shown in FIG. 2A.

The library registration unit 11 stores extracted an improper OPC pattern and corrective treatments corresponding to the improper OPC pattern in the library storage medium 41. As shown in FIG. 2B, the library registration unit 11 includes a data acquisition unit 11a, an error point determinator 11b, a pattern variation analysis unit 11c, a pattern variation extraction unit 11d, an action analysis unit 11e, and a data storing unit 11f. The data acquisition unit 11a acquires at least one of the following data: test patterns stored in the test pattern storage medium 40, layout patterns stored in the layout storage medium 43, and error point data stored in the error point storage medium 42. The error point determinator 11b extracts the improper OPC pattern which has an error in the OPC test patterns. "improper OPC patterns" may include the following patterns, for example:

(a) a pattern which imposes a problem because it is not applicable to calibration of the OPC model;

(b) a pattern which once was a problem in the OPC in the same process generation;

(c) a pattern which is likely to have a problem in a variation of hazardous patterns (dense pattern, peculiar pattern which conforms to the design rule but is rarely found), then is determined to have a problem through the OPC and the simulation; and (d) a pattern which is determined to have a problem by wafer verification using a test element group (TEG).

The error point determinator 11b extracts any region or a part which may cause a defect, and its surrounding pattern which has a significant influence on the problematic region, and generates variations of the surrounding pattern which is extracted associated with the problematic region. Next, error point determinator 11b determines if a variation may cause any problem in the problematic region or not, and determines if a problem such as short-circuit, breakage, excessive thin/thick interconnect exists in the variation pattern or not.

The error point determinator 11b then extracts a patterns which may cause a problem in the problematic region.

The pattern variation analyses unit 11c allocates variation patterns based on error patterns to the extent of the design rule, simulates and analyze whether an error point causes a problem in a variation pattern.

The pattern variation extraction unit 11d extracts a variation pattern having an error point that causes a problem.

The action analysis unit 11e analyzes an corrective treatment, where an error point is not a problem, against a variation pattern extracted in the pattern variation extraction unit 11d.

The data storing unit 11f stores an error pattern and a variation pattern in library storage medium 41 as an improper OPC pattern along with the corrective treatments corresponding to the error pattern and the variation pattern.

Figure 2C:
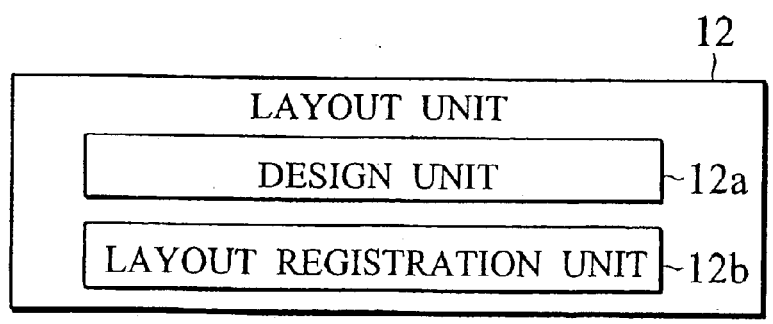
FIG. 2C is a block diagram illustrating a layout unit of the OPC system shown in FIG. 2A.

As shown in FIG. 2C, the layout unit 12 includes a design unit 12a and a layout registration unit 12b. The layout unit 12 re-layouts an improper OPC pattern to be a proper OPC pattern in a layout designing stage. The design unit 12a corrects and re-design the proper OPC pattern based on the result of pattern matching performed by the pattern-matching unit 15. The layout registration unit 12b stores layout designed by the design unit 12a in the layout storage medium 43.

Figure 2D:
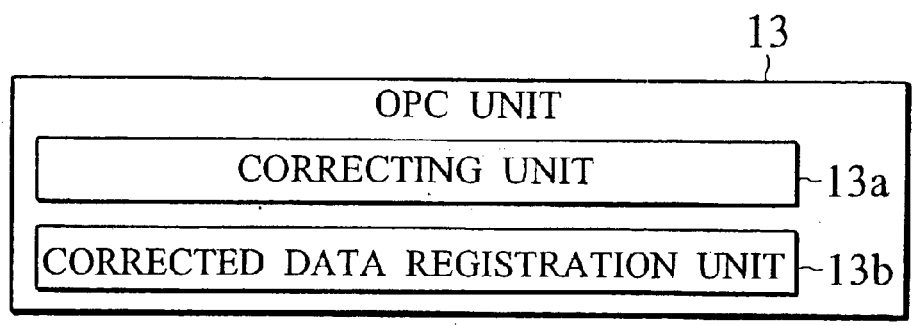
FIG. 2D is a block diagram illustrating an OPC unit of the OPC system shown in FIG. 2A.

As shown in FIG. 2D, the OPC unit 13 includes a correcting unit 13a and a corrected data registration unit 13b. The OPC unit 13 corrects layout data by using an improper OPC pattern adequately. The correcting unit 13a extracts an corrective treatment (a rule or a model) stored in the library storage medium 41, applies the corrective treatment to a corresponding section to the target test pattern which corresponds to the improper OPC pattern stored in the library storage medium 41, and corrects the errors in the corresponding section. The corrected data registration unit 13b stores corrected data in corrected layout storage medium 44.

Figure 2E:
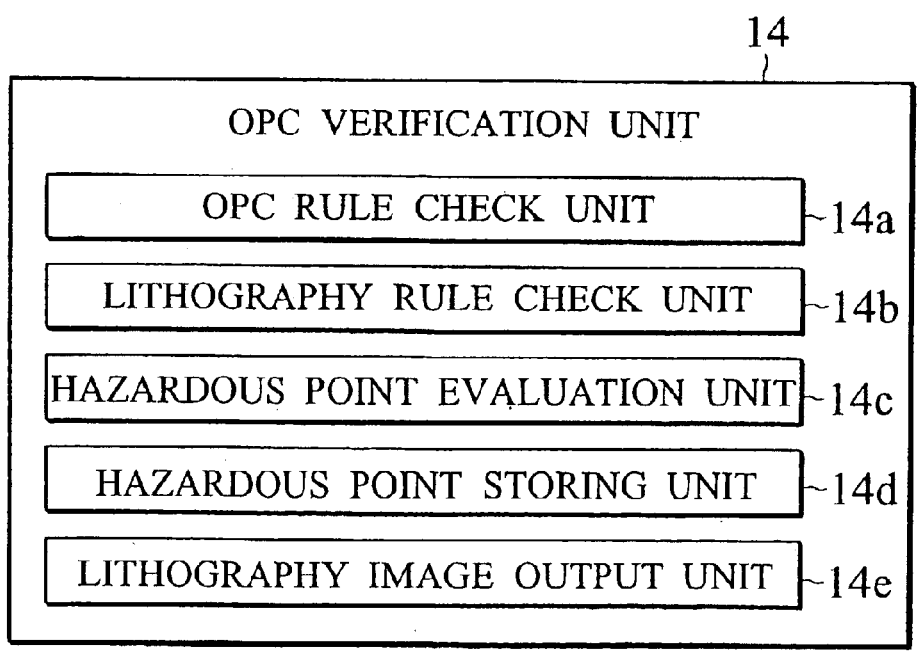
FIG. 2E is a block diagram illustrating an OPC verification unit of the OPC system shown in FIG. 2A.

As shown in FIG. 2E, the OPC verification unit 14 includes an OPC rule check unit 14a, a lithography rule check unit 14b, a hazardous point evaluation unit 14c, a hazardous point storing unit 14d, a lithography image output unit 14e. At first, the OPC verification unit 14 verifies graphical validity of a pattern after an OPC process, extracts error points (based on a simplified simulation), and verifies lithography image outputs. Then, the OPC verification unit 14 verifies whether a correction violates a mask production limit or process limit arranged beforehand. The OPC rule check unit 14a verifies graphical validity of the pattern after an OPC process by using a design rule check (DRC). For example, it verifies whether corrections violate an arranged mask production limit or process limit. The lithography rule check unit 14b extracts points which causes an error in a lithography rule check. The hazardous point evaluation unit 14c analyzes the hazardous point extracted and verifies whether there is any hazardous point. The hazardous point storing unit 14d stores the hazardous point in hazardous point memory storage 45. Lithography image output unit 14e outputs a lithography image of a mask pattern, and determines if there is any error point.

The pattern check unit 35 shown in FIG. 2A includes a mask check unit 36, a resist-pattern check unit 37, and an etching inspection unit 38. The mask check unit 36 may be transmissive, or may be reflective such as an optical microscope. A transmissive mask check unit may include an X-Y stage on which the mask (reticle) is mounted and moved, a light source for supplying light to the mask, and an image sensor for detecting the light passed through the mask. The mask check unit 36 checks any defect existing in the completed mask pattern. The resist-pattern check unit 37 checks any defect existing in the resist pattern that is exposed and developed on the wafer using an optical microscope such as a laser microscope. The etching inspection unit 38 checks the finished surface of the wafer after the wafer is etched using the resist pattern as an etching mask, and the resist pattern is removed from the wafer. An optical microscope or a scanning electron microscope (SEM) may be used as the etching inspection unit 38. When checking the cross-section of the wafer, the etching may be inspected with the SEM without removing the resist pattern.

The input unit 31 may include a keyboard, a mouse and an OCR or similar recognition device a graphics input unit such as an image scanner, or a special input unit such as a voice pattern recognition unit, while the output unit 32 may include a display unit such as a liquid crystal display, a CRT display, or a printer such as an ink jet printer or a laser printer.

The input/output control unit (input/output interface) 34 is an interface which connects the mask check unit 36, the resist-pattern check unit 37, the etching inspection unit 38, the input unit 31, the output unit 32 and a reading unit which reads data from storage media such as a CD-ROM, MO or ZIP (not shown), to the CPU 30. In terms of the data flow, the input/output control unit 34 is the interface to the mask check unit 36, the resist pattern check unit 37, the etching inspection unit 38, the input unit 31, the output unit 32, and the reading unit from an external storage medium. A main memory 33 incorporates ROM and RAM. ROM functions as a program storage medium which stores a program to be run by the CPU 30. RAM functions as temporary data memory which may store previously used data, and may also be used as a working area when a program is run by the CPU 30. A test pattern storage medium 40 is a storage medium to store the OPC test patterns. A library storage medium 41 is a storage medium to store the improper OPC patterns and the OPC settings as corrective treatments against such improper OPC patterns. A layout storage medium 43 is a storage medium to store layout design data. An error part storage medium 42 is a storage medium to store error parts. A post-correction layout storage medium 44 is a storage medium to store a layout corrected based on the OPC settings. The hazardous part storage medium 48 is a storage medium to store parts which may possibly cause an error (hazardous parts).

The OPC check system 1 according to an embodiment of the present invention is organized as described above. Such an OPC check system may require less time to establish an environment for layout design and inspection than the conventional system.

The OPC system according to an embodiment of the present invention may reduce the time necessary for OPC compared to the conventional system by extracting improper OPC patterns and storing them in the library storage medium in advance. The OPC system according to an embodiment of the invention further includes the pattern matching unit which conducts pattern matching between the mask layout obtained in each unit and the improper OPC pattern stored in the library storage medium, the action extraction unit which selects the corrective treatment corresponding the improper OPC pattern (correction of the rule or the model), the correction unit which corrects the mask pattern according to the selected corrective treatment, and the registration unit which registers the mask patterns, the corrective treatments and the corrected patterns in the library storage medium, for each unit of the layout unit, the OPC unit, the rule check unit, and the hazardous part register, respectively. This configuration may provide simplified processing and reduced OPC processing time.

OPC Method

Figure 3A:
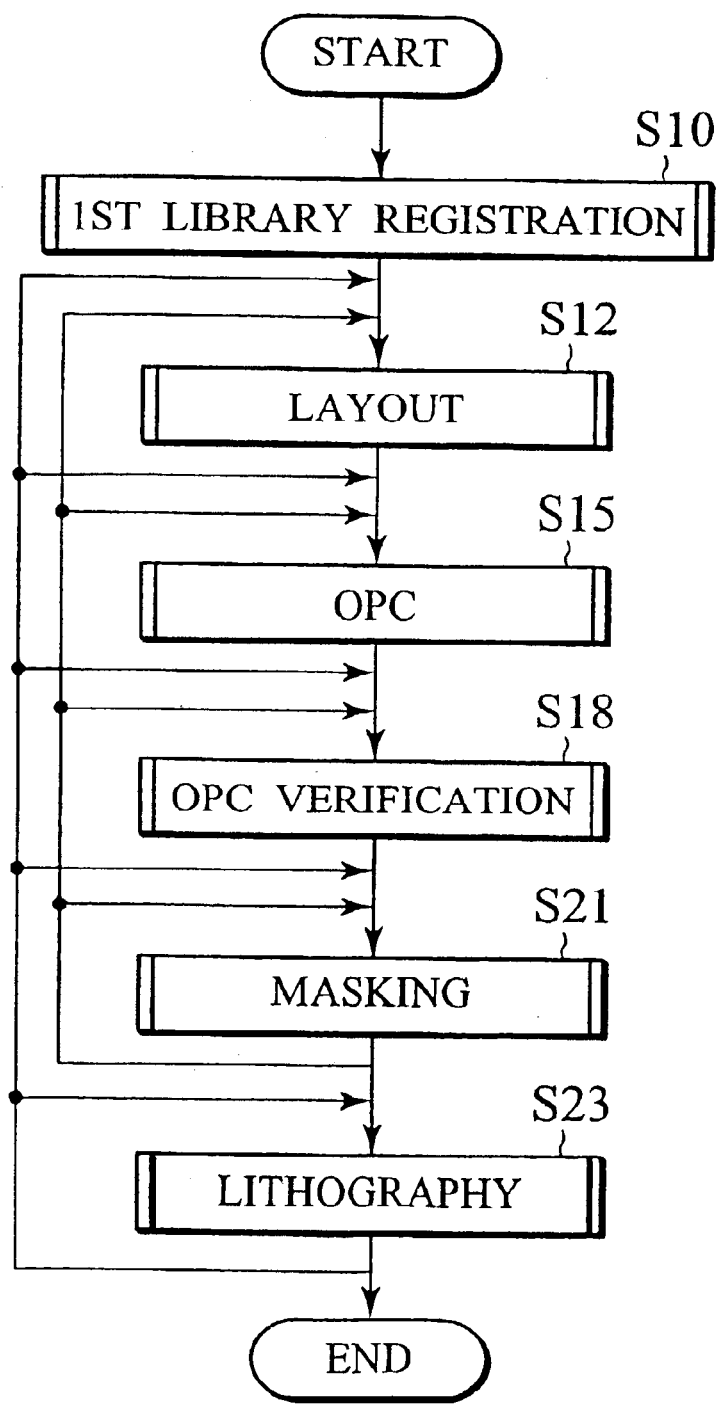
FIG. 3A is a flow chart illustrating the OPC process according to the present invention.

Next, the optical proximity verification method according to an embodiment of the present invention is described. It should be noted that the following optical proximity verification method is merely an example, and the invention may be implemented by using various methods including variations of the described method. FIG. 3A illustrates the entire flow chart of the OPC process of the present invention.

(a) In step S10 shown in FIG. 3A, the library registration unit 11 stores improper OPC patterns in the library storage medium 41.

(b) In step S12, the layout unit 12 designs layout, and verifies layout patterns by using design rule check (DRC)/layout versus schematic (LVS). Then, the pattern matching unit 15 matches the verified layout pattern data with the improper OPC patterns stored in the library storage medium 41, and patterns which match with the improper OPC patterns and patterns which do not match with the improper OPC patterns are separately stored in the layout storage medium 43.

(c) In step S15, the OPC unit 13 first extracts and synthesize object patterns for correction. For this extraction and synthesis, the pattern matching unit 15 matches the object patterns to the improper OPC patterns stored in the library storage medium 41. The object patterns, which match with the improper OPC patterns, are corrected based on the corrective treatments stored in the library storage medium 41 with the improper OPC patterns. The object patterns, which do not match with the improper OPC patterns, are performed the OPC process. Then, corrected layout patterns are stored in the corrected layout storage medium 44.

(d) In step S18, OPC verification unit 14 verifies OPC. The OPC rule check unit 14a, shown in FIG. 2E, checks the validity of a corrected pattern stored in the corrected layout storage medium 44 by using DRC and LVS. The pattern matching unit 15 matches the corrected pattern to the improper OPC patterns stored in the library storage medium 41 as a lithography check. Then, the hazardous point evaluation unit 14c identifies any pattern which has an error greater than the predetermined acceptable error value and extracts as a hazardous points. Then, the hazardous point storing unit 14d stores the hazardous points in the hazardous point storage medium 48. Further more, the lithography image output unit 14e outputs a lithography image and match the lithography image with the improper OPC patterns stored in the library storage medium 41. If there is a pattern, which does not match with the improper OPC pattern, store the pattern in the library storage medium 41 to apply the library registration process.

(e) Next, in step S21, the OPC verified pattern data is converted for electron beam lithography system (herein after called "EB data") and a number of photo masks sets are produced by using the EB data. Then, the mask check unit 36 checks the photo masks. When a photo mask is determined as an improper OPC pattern, the mask is registered in the library storage medium 41, and the process returns to the layout design process in step S12. When the photo mask is determined as a proper OPC pattern, the process proceeds to the wafer lithography process in Step S23.

(f) In step S23, a photo-resist film is spin-coated on a wafer by using a spinner. The photo mask, which is determined as the proper OPC pattern, is pressed against a photo-resist film covered wafer and exposed by light. Then, the resist-pattern check unit 37 checks the lithography pattern check. If a desired pattern is not printed, the pattern is stored in the library storage medium 41 as an improper OPC pattern, and a process goes back to the step S12 to re-design the layout. If a desired pattern is printed, quit the lithography process.

Library Registration

Next, the process of the first library registration, shown in step S10 FIG. 3A, is described with reference to the FIG. 3B.

(a) In step S101, the data acquisition unit 11a reads a test pattern from the test pattern storage medium 40, or read the layout pattern from the layout storage medium 43 and error point from the hazardous point storage medium 48. In step S102, the error point determinator 11b extracts a region which may be under influence of the proximity effect around the problematic region under the current OPC setting (rule or model) is selected (hereinafter referred to as an "error pattern"). For example, in the layout pattern sown in FIG. 4B, if an error occurs between the FIGS. 50b and 50e inside of region 50, the region 50 is selected as an error pattern from layout pattern 49.

Figure 4A:
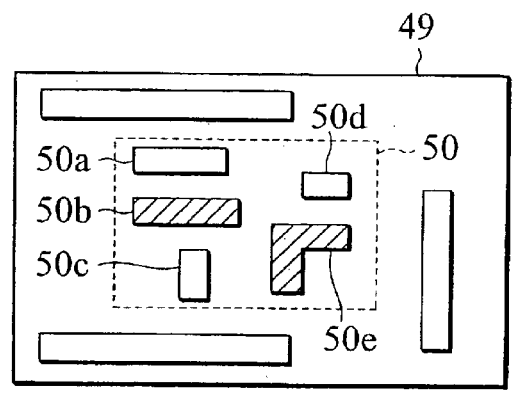
FIG. 4A is a diagram illustrating an exemplary error region in an improper OPC pattern.
Figure 4B:
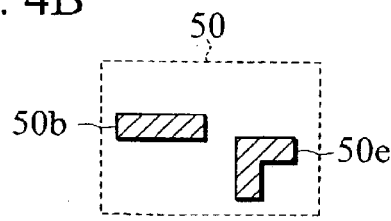
FIG. 4B is a diagram illustrating exemplary problematic figures of FIG. 4A.

(b) In step S102, the error point determinator 11b determines the FIGS. 50b and 50e which may directly cause an error from the region (error pattern) 50 extracted in Step S125, as shown in FIG. 4B.

Figure 4C:
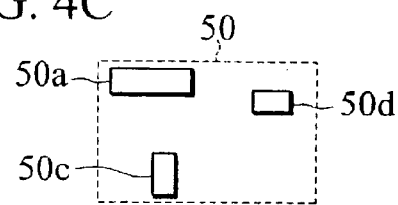
FIG. 4C is a diagram illustrating an exemplary surrounding region within the error region in FIG. 4A.
Figure 4D:
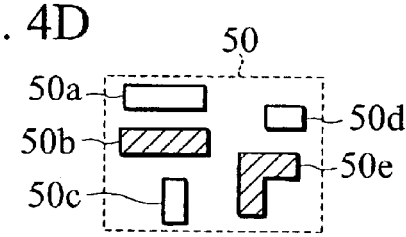
FIG. 4D is a diagram illustrating an exemplary error region in FIG. 4A.

(c) In step S104, the error point determinator 11b also extracts other peripheral figures (50a, 50c and 50d) which have significant influence on the error as shown in FIG. 4C.

Figure 4E:
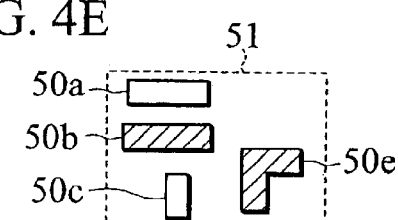
FIG. 4E, FIG. 4F and FIG. 4G are diagrams illustrating exemplary variation patterns having the problematic figures shown in FIG. 4B.
Figure 4F:
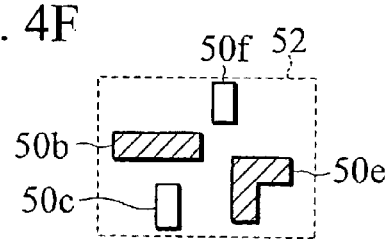
Figure 4G:
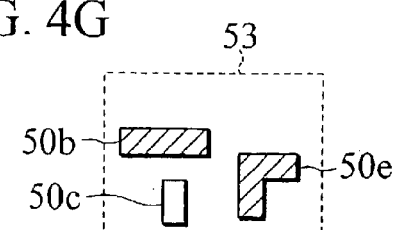

(d) In step S105, the pattern variation analysis unit 11c analyses the variation of the error patterns that have different layouts from the error pattern 50 in the scope of the design rules. Then, the problems (defects) are simulated such as short-circuit, breakage, and excessively narrow/thick interconnect, and the variations are classified into two groups, i.e., patterns that have problems and patterns without any problems. After classification of the patterns, the variations of the error patterns 51, 52 as shown in FIGS. 4E and 4F may be extracted by the pattern variation extraction unit 11d. Also, patterns without any error (FIGS. 50b, 50c) as shown in FIG. 4G, and pattern having no evident influence on the error area are excluded.

(e) In step S106 FIG. 3B, the pattern variation extraction unit 11d analyses the variation pattern 51 and 52 to determine the corrective treatment (referred to corrective treatments 101 and 102 in FIG. 5) for each variation patterns.

(f) Next, the action analysis unit 11e verifies the effects of the other patterns by changing the OPC settings. For example, as shown in FIG. 6C, the action analysis unit 11e verifies whether the change in the OPC setting will have any influence on the other region such as insufficient contact coverage on the contact halls 64c and 65c, or misalignment in the line width of the FIGS. 60 and 61. When an error such as insufficient contact coverage or misalignment in the line width is unacceptable, the corrective treatment is determined to have a "side effect", and other corrective treatments such as changing other OPC settings or changing the layout may be considered. The layout change is a method wherein the OPC setting remains the same while the disposition (layout) of the FIGS. 60 and 61 is changed to increase the space between the figures, to avoid any side effect such as short-circuiting, insufficient contact coverage, or misalignment in the line width. When there is no problem or only an acceptable problem, the treatment is considered as "free from a side effect", and two of the treatments such as a change in the OPC settings or a change in the layout are extracted.

(g) In step 107, the extracted treatment is applied to each of the error patterns (including the variation patterns), and the action analysis unit 11e evaluates whether the treatment has any side effects to the surrounding figures and patterns. If there is a problem, the process goes back to step S106 to re-analyze a treatment for the layout pattern. If there is no problem, the process proceeds to step S108.

Figure 5:
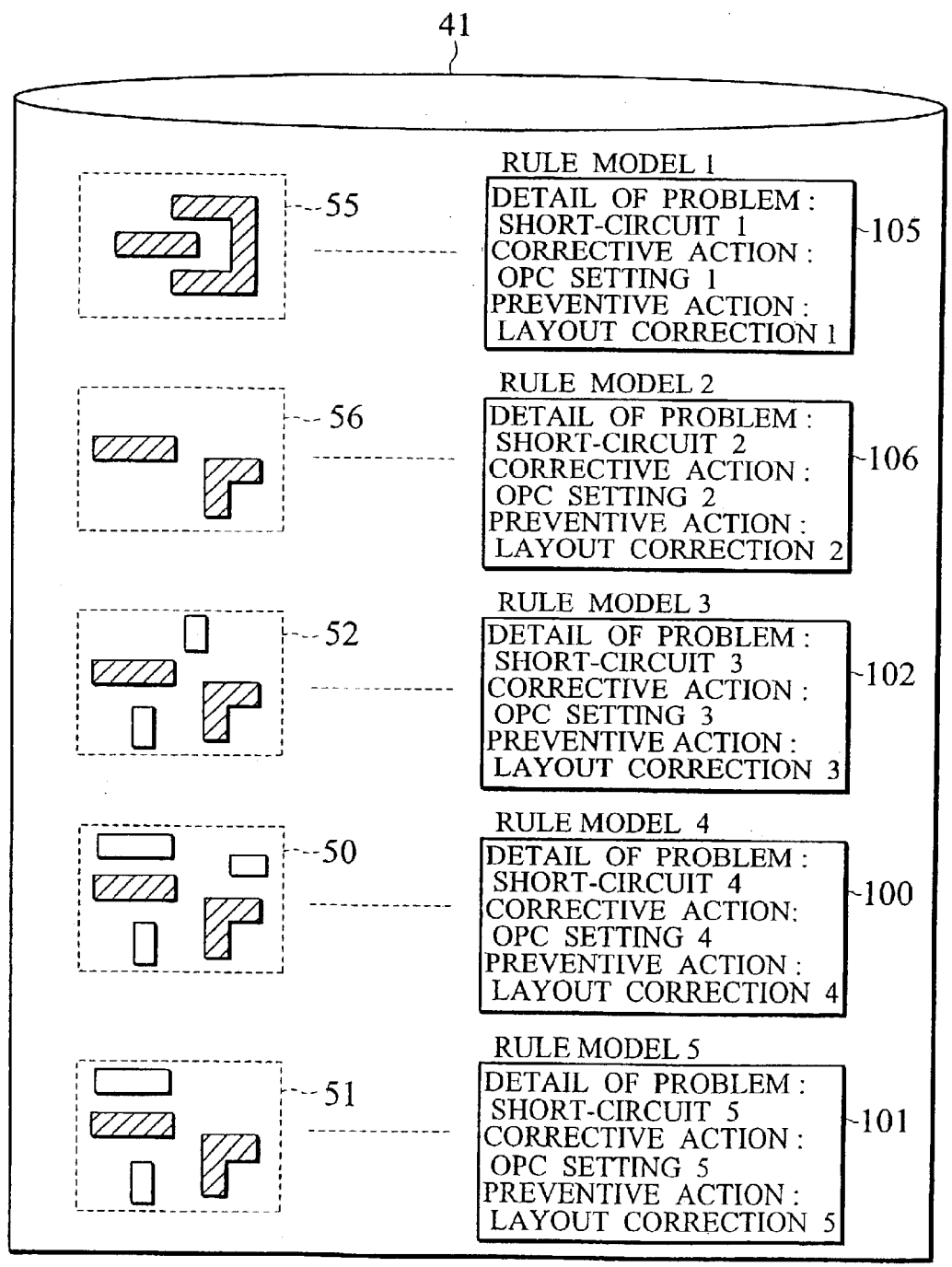
FIG. 5 is a diagram illustrating a layout storage medium shown in FIG. 2A.

(h) As shown in FIG. 5, in step S108, the data storing unit 11f stores the error pattern 50 and the variation patterns 51 to 56 as improper OPC patterns in the library storage medium 41. In addition, as shown in FIG. 5, the data storing unit 11f also stores the collective treatment 100 to 106 (For example, change in OPC model, OPC rules and layout of the pattern) in the library storage medium 41 as rule models of each of the improper OPC patterns. A "collective treatment" or a "rule model" 101 to 106 of the improper OPC patterns 50 to 56 include details of the problems such as a short-circuit, breakage, an interconnect having a width narrower/thicker than the acceptable width, and a corrective treatment or preventive treatment such as correction of the layout. By conducting pattern matching between the patterns generated in each step, and the improper OPC pattern data stored in the library storage medium 41, error patterns (improper OPC patterns) may be instantly selected.

When the improper OPC patterns 51 to 56 and their collective patterns 101 to 106 are stored in te library storage medium 41, the first library registration process is finished, and the process goes back to step S12 in FIG. 3A.

The first embodiment of the present invention is able to extracts more than one error patterns and collective treatments by analyzing variation patterns (or error pattern variations) for the extracted error patterns with their collective treatment at the same time the present invention extracts the error pattern and its collective treatment. Prior to the analyzing and extracting of the variation and simulation of the pattern, the region free from influence on the problematic region is determined, in order to minimize the designation of the pattern variation. Thus, the designation of the variation and the simulation of the pattern can be conducted for a relevant scope without loss.

Analyzing the Corrective Treatment

Next, a method for corrective treatment for the improper OPC patterns and its variation patterns corresponding to step S106 will be described with reference to FIG. 6A to FIG. 6D.

Figure 6A:
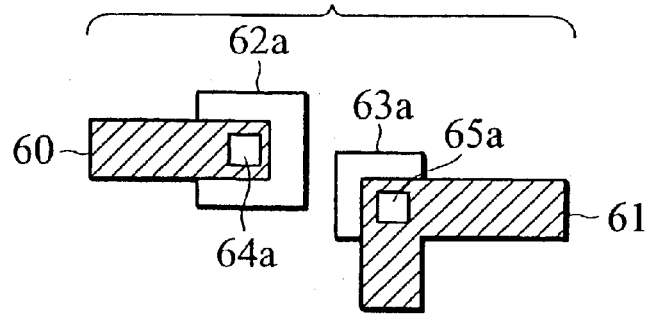
FIG. 6A is a diagram illustrating an exemplary improper OPC pattern according to the present invention.
Figure 6B:
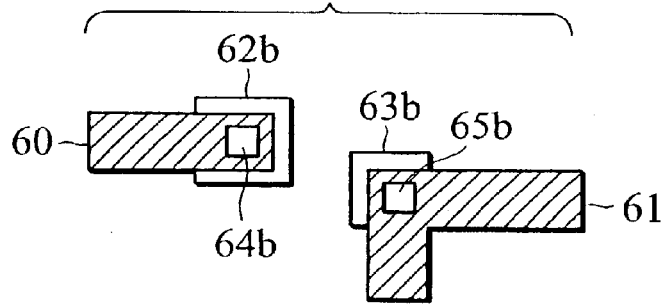
FIG. 6B is a diagram illustrating an exemplary improper OPC pattern after OPC.
Figure 6C:
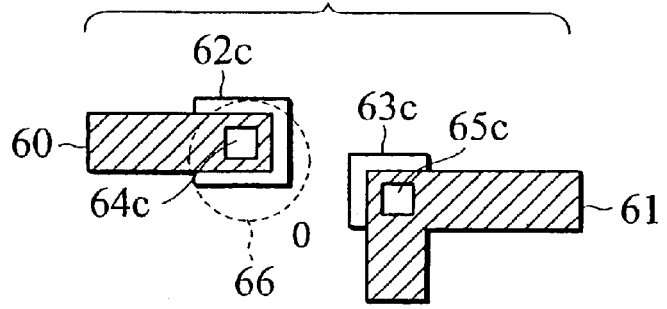
FIG. 6C is a diagram illustrating an exemplary error point when OPC process is applied to the layout pattern shown in FIG. 6B.
Figure 6D:
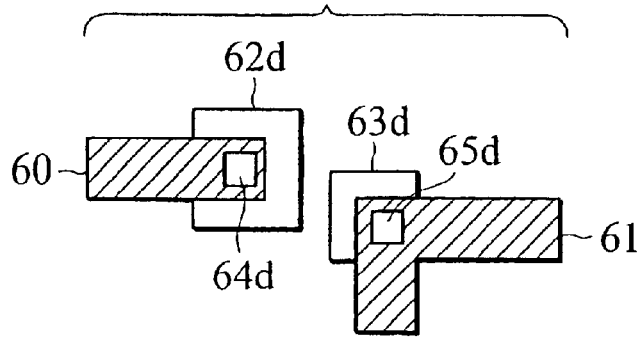
FIG. 6D is a diagram illustrating an exemplary case wherein the error point in the improper OPC pattern in FIG. 6C is avoided.

When the pattern shown in FIG. 6A is generated by the correction under the current OPC settings, the FIGS. 60 and 61 become closer, that is, the space between the two figures becomes too narrow in the area of the corrected parts 62a and 63a, as the result of OPC. Thus, the narrow space may lead to a short-circuit. As shown in FIG. 6B, by setting a minimum value for the space by the treatment analysis unit 11e, when conducting the OPC on the FIGS. 60 and 61, the area of the correction parts 62b and 63b can be minimized to avoid the short-circuit causes defects.

Layout Designing

The Layout designing (S12) for OPC according to an embodiment of the present invention is described with reference to FIG. 3C, and FIG. 7A to FIG. 7C.

Figure 3C:
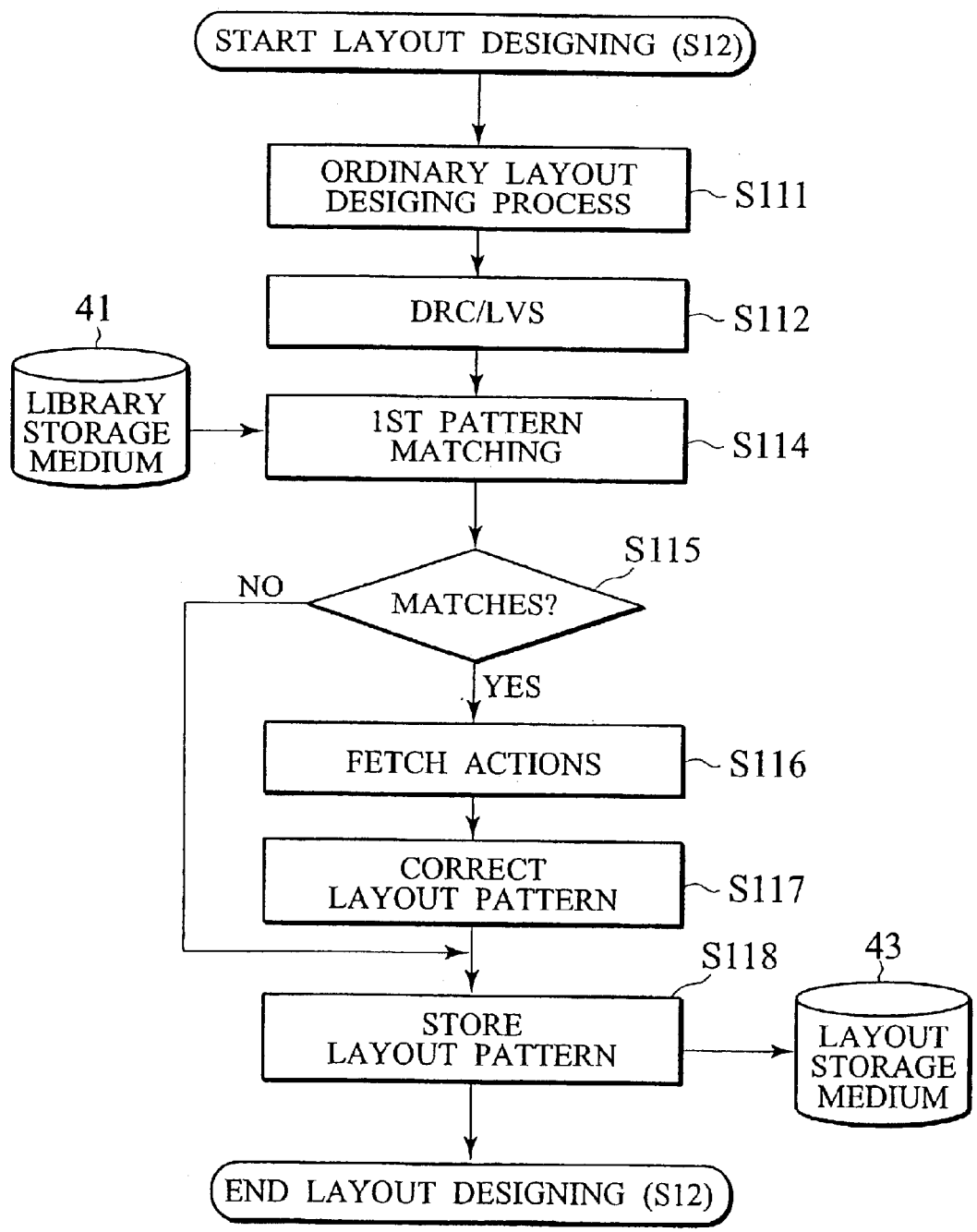
FIG. 3C is a flow chart illustrating the layout designing process in step S12 of FIG. 3A.

(a) In step S111 in FIG. 3C, the layout is designed in an ordinary semiconductor manufacturing process. Then, in step S112, the layout is verified by using DRC or LVS, a layout design of a circuit block is designed, and the layout pattern (or a test pattern) is produced.

Figure 7A:
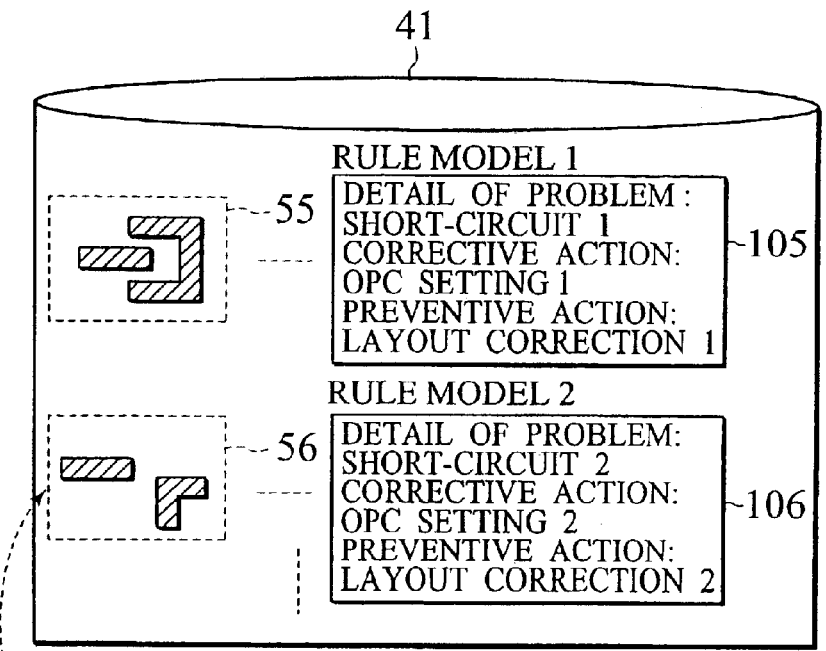
FIG. 7A is a diagram illustrating a library storage medium shown in FIG. 2A.
Figure 7B:
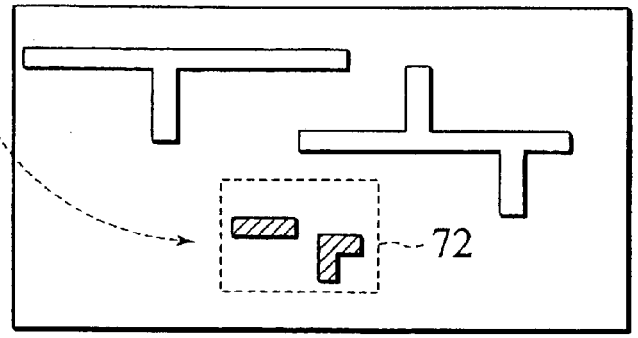
FIG. 7B is a diagram illustrating exemplary test pattern for pattern matching to the improper OPC patterns stored in the library storage medium shown in FIG. 7A.
Figure 7C:
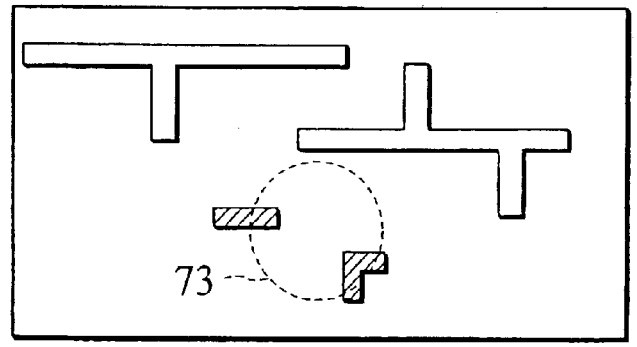
FIG. 7C is a diagram illustrating exemplary corrective treatment for the error pattern shown in FIG. 7B.

(b) In step S114, the pattern matching unit 15 matches the test pattern 72, the verified layout pattern, as shown in FIG. 7B to the improper OPC patterns 50 to 56 stored in the library storage medium 41 as shown in FIG. 5 and FIG. 7A. Then, in step S115, the pattern matching unit 15 verifies whether the test pattern 72 matches to any of the improper OPC patterns 50 to 56. The evaluation of the improper OPC patterns may be done on the layout editor as with the DRC. The result of the evaluation is highlighted on the layout editor. If the test pattern 72 does not matches to the improper OPC patterns 50 to 56 stored in the library storage medium 41, the process goes to step S118. If the test pattern matches to the improper OPC patterns 50 to 56, the details of the problem and the corrective treatment, stored in the library storage medium 41 are retrieved in step S116.

(c) In step S117, the test pattern 72 which matches to the improper OPC pattern 56 can be corrected on the layout editor when an applicable rule or model (the corrective treatment) is retrieved from the library storage medium 41 in step S116. In the present invention, the test pattern 72, shown in FIG. 7B, matches to the improper OPC pattern 56, shown in FIG. 7A, stored in the library storage medium 41. The corrective treatment for the test pattern 72 is the corrective treatment 106. Therefore, based on the information of the corrective treatment 106, a corrective part 73, shown in FIG. 7C, of the test pattern 72 is corrected by making some space between the figures, which cause an error.

(d) In step S118, the layout registration unit 12 shown in FIG. 2C stores the corrected layout patterns and the patterns which did not match to the improper OPC patterns separately in the library storage medium 41.

The layout design for OPC according to the embodiment of the present invention does not limit its use to the configuration shown in the figures. It should be noted that it may be applicable in an environment completed with a design support tool such as an automated alignment and wiring tool, or a design migration tool.

OPC Processing

Figure 3D:
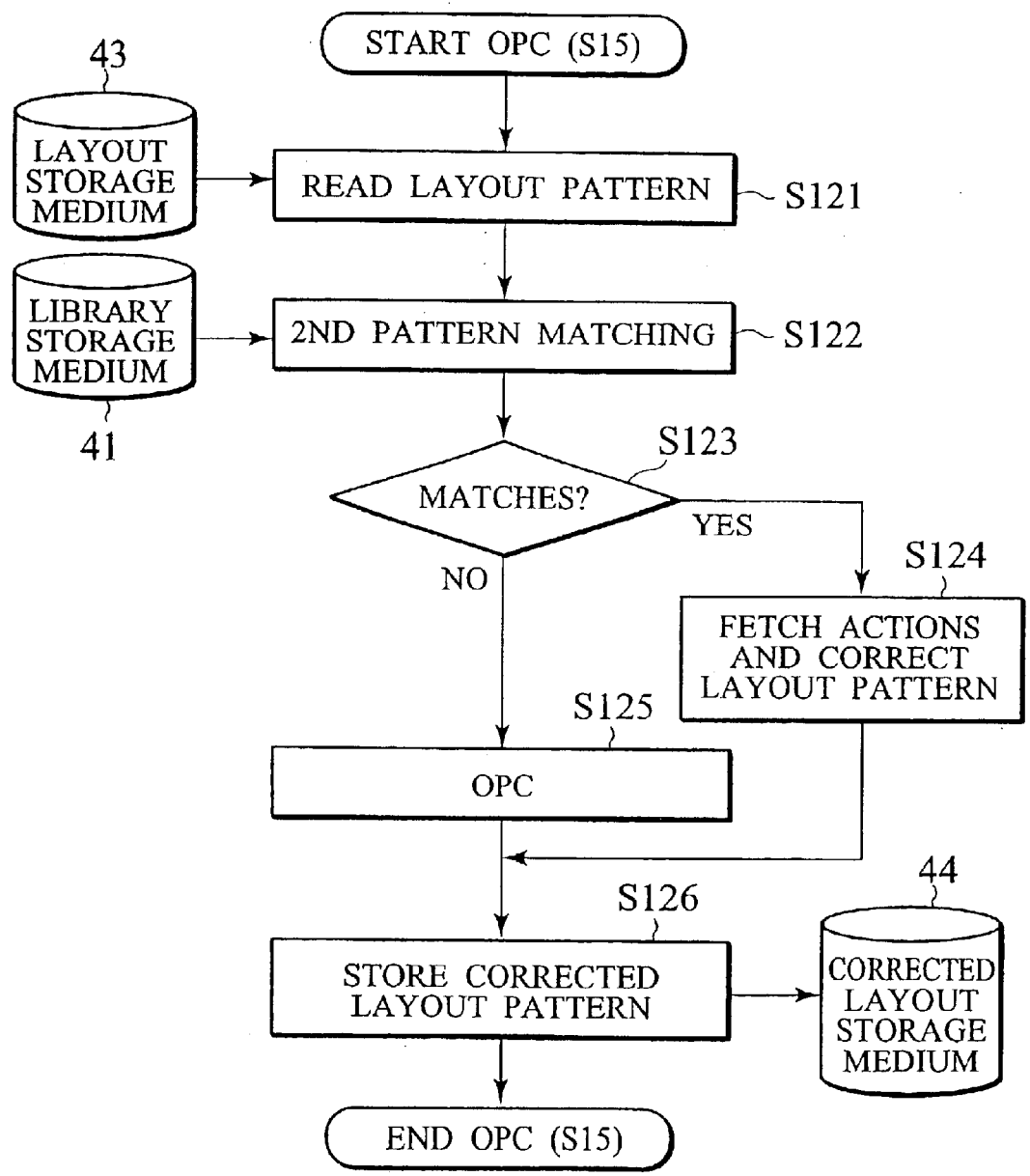
FIG. 3D is a flow chart illustrating the OPC process in step S15 of FIG. 3A.

Next, a method for OPC Processing (S15) is explained with reference to FIG. 3D.

(a) In step S121, the OPC unit 13 read the layout pattern, which may be a verified layout pattern or a corrected layout pattern, from the layout storage medium 43.

Figure 8A:
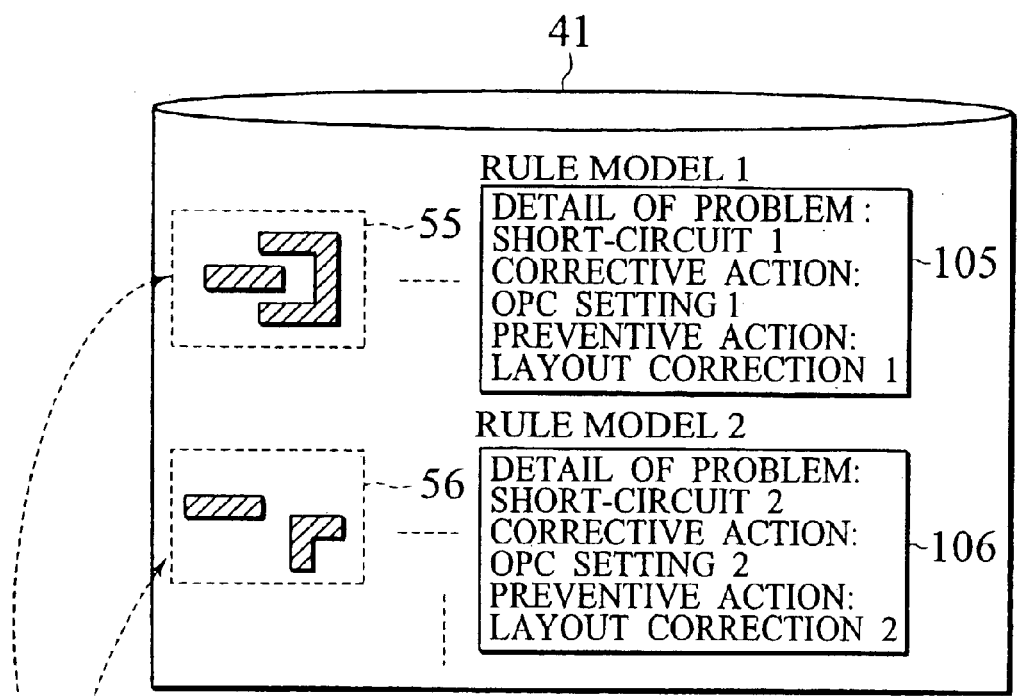
FIG. 8A is a diagram illustrating exemplary pattern matching.

(b) In step S122, the pattern matching unit 15 matches the layout patterns (test patterns) 70 and 71, shown in FIG. 8A, to the improper OPC pattern 55 or 56 stored in the library storage medium 41.

(c) In step S123, the pattern matching unit 15 verifies whether the layout pattern (a test pattern) 70 or 71 matches to the improper OPC pattern 55 or 56. If the layout pattern 70 or 71 matches to the improper OPC pattern 55 or 56, the correcting unit 13a in FIG. 2D extracts and applies the corrective treatment 105 or 106 stored in the library storage medium 41 to correct error points of the test pattern 70 or 71 in step S124. For example, as shown in FIG. 10, the test pattern 70 matches to the improper OPC pattern 55, and the test pattern 71 matches to the improper OPC pattern 56. Therefore, the correcting unit 13a extracts and applies the corrective treatment 105 to correct an error point of the test pattern 70 and the corrective treatment 106 to correct an error point of the test pattern 71. After correcting the errors in the test patterns 70 and 71, the process proceeds to step S126.

(d) In step S123, if the test pattern 70 or 71 does not match to the improper OPC pattern 55 or 56, the OPC process is directly applied to the test pattern 70 or 71 in step S125.

(e) In step S126, the test patterns 70 and 71 corrected in step S124 or step S125 are stored in the corrected layout storage medium 44 as corrected layout patterns, and the OPC process show in step S13, FIG. 3A is ended. Based on the result of the pattern matching, the OPC setting (or the corrective treatment) for the improper OPC pattern stored in the library storage medium 41 is applied to the relevant region in the evaluated pattern to correct errors, and the current OPC stting is applied to the region which does not match the improper OPC pattern. In the OPC process, the method may be implemented wherein (i) usage of the model is differentiated among the regions which require different degrees of accuracy, (ii) the OPC is conducted sequentially for each process using a model or a rule specifically designed for each process of mask production, wafer lithography and etching.

OPC Verification

Figure 3E:
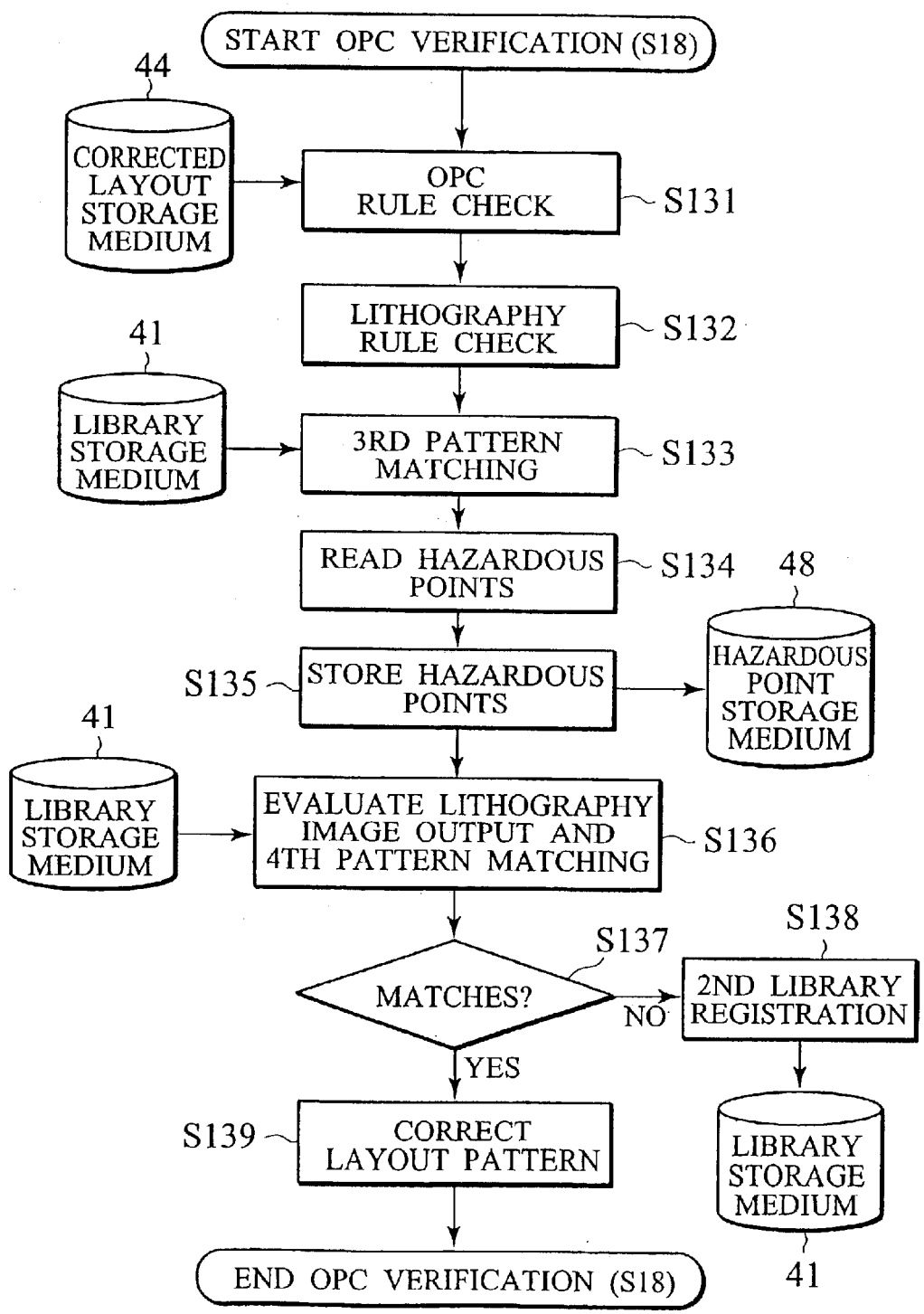
FIG. 3E is a flow chart illustrating the OPC verification process in step S18 of FIG. 3A.

The OPC verification in step S18, FIG. 3A is described with reference to FIG. 3E.

(a) In step S131, the OPC rule check unit 14a in FIG. 2E checks the validity of the corrected layout patterns stored in the corrected layout pattern storage medium 44 by using the DRC and other possible methods. For example, the OPC rule check unit 14a verifies whether a corrective treatment exceeds the limit values set in the mask check and the mask manufacturing process.

(b) In step S132, the lithography rule check unit 14b in FIG. 2E processes the lithography rule check. First, in step S 133, the lithography rule check unit 14b extracts the layout pattern or the corrected layout patterns stored in the library storage medium 41 or the corrected layout storage medium 44. Then, the pattern matching unit 15 matches the layout pattern or the corrected layout pattern to the improper OPC patterns stored in the library storage medium 41. The lithography rule check unit 14b extracts error point from the layout pattern or the corrected layout pattern. Then, the hazardous point evaluation unit 14c verifies the error points to extracts any pattern that has an error greater than the predetermined acceptable error value. In this process, the pattern matching unit 15 is also used to match the layout pattern to the corrected layout patterns to the improper OPC patterns. Then, the hazardous point storing unit 14d stores information about the error points of the layout pattern or the corrected layout pattern.

(c) In step S136, the lithography image output unit 14e output the lithography image and verifies the validity of the output lithography image. The pattern matching unit 15 may also match the lithography image and the improper OPC patterns stored in the library storage medium 41 in this process.

(d) In step S137, if the layout pattern or the corrected layout pattern matches to the improper OPC pattern, the corrective treatment stored in the library storage 41 is applied to the layout pattern or the corrected layout pattern.

Figure 8B:
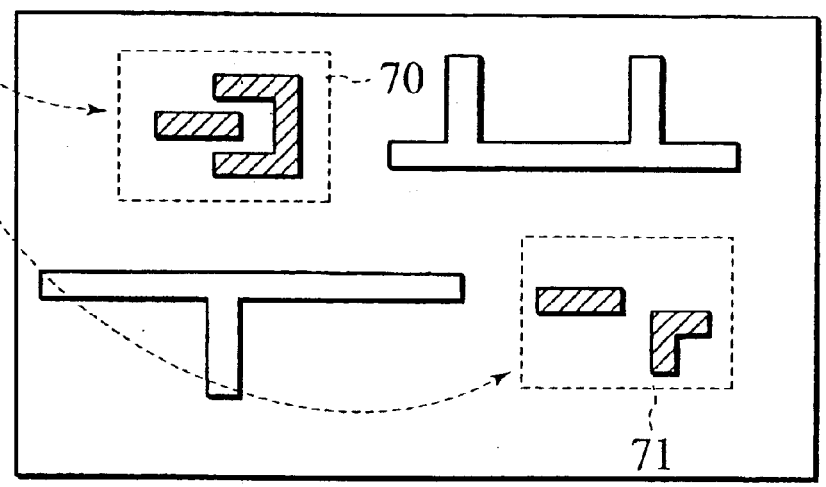
FIG. 8B is a diagram illustrating test patterns which is pattern matched with the improper OPC patterns in FIG. 8A.

As shown in FIG. 8B, in order to apply the OPC verification process to a plurality of rules or models, a plurality of the rules and models are used for correcting each error points. For example, the layout pattern (the test pattern) 70 is corrected by using the rule model (the corrective treatment) 105 since the layout pattern 70 matches to the improper OPC pattern 55 stored in the library storage medium 41. The layout pattern (the test pattern) 71 is corrected by using the rule model (the corrective treatment) 106 since the layout pattern 71 matches to the improper OPC pattern 56 stored in the library storage medium 41. In the OPC verification, when the new rules and models (the corrective treatment) are applied to correct the layout pattern, the new rules and models are used to verify the validity of the OPC process.

Mask Manufacturing

Figure 3F:
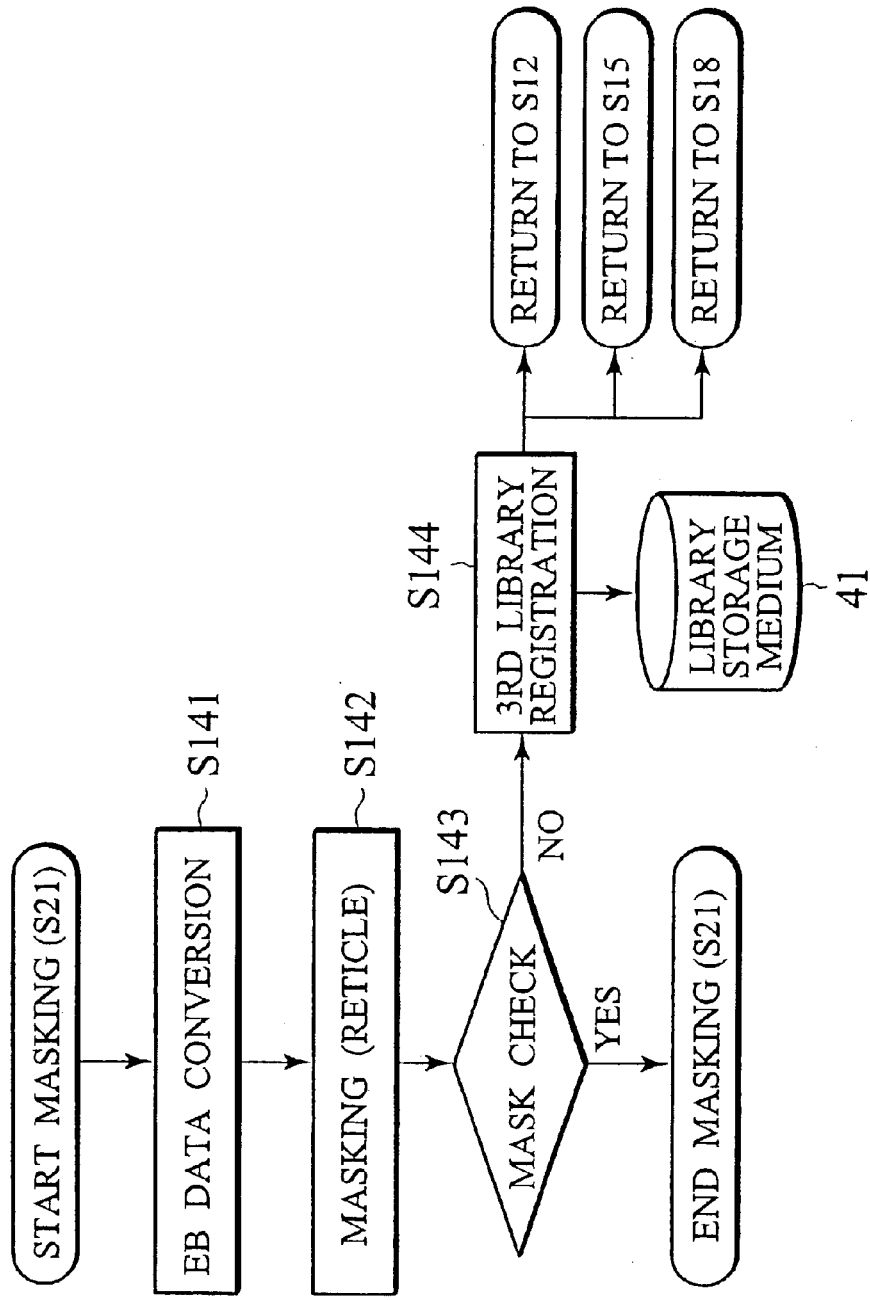
FIG. 3F is a flow chart illustrating the mask production process in step S21 of FIG. 3A.

As shown in FIG. 3F, the mask production process in step S21, FIG. 3A, is going to be explained.

(a) In step S141, the OPC verified layout pattern data is converted to data for electron beam lithography system (EB). In step S142, a set of photo masks is produced by using the converted EB data. Ion step S143, the mask check unit 36 checks the set of the photo masks to verify whether the masks (reticles) are improper OPC patterns or not. If a mask is an improper OPC pattern, a third library registration is processed in step S144. The third library registration follows the same processes from step S101 to step S108 in FIG. 3B. Then, in order to re-design the layout, the process goes back to step S12. In order to re-process the OPC process, the process goes back to step S15. In order to re-verifies, the process goes back to step S18. In step S143, the mask production process is ended when the patterns are proper OPC patterns.

Lithography

As shown in FIG. 3G, the lithography process of step S23 (FIG. 3A) is going to be explained.

(a) In step S150, a thin film is generated by CVD, vacuum evaporation method, and sputtering on a wafer. Isolation films such as an oxide film, a nitride film, a non-doped polysilicon film, electro-conductive thin films such as a doped polysilicon film, a metal film, properly elected for corresponding manufacturing process are used as thin films.

(b) In step S151, a photo-resist film is spin-coated on the semiconductor wafer using a spinner, and the photo-resist film is exposed using the produced reticle that is certificated as the photomask having the proper OPC patterns and mounted on the stepper. Then, the process proceeds to rinsing, post-baking, curing, and the lithography check in step S152.

(c) In step S152, the resist-pattern check unit 37 checks the photo-resist pattern on the wafer. When the pattern is determined to be an improper OPC pattern, a fourth library registration in step S153 is performed. The fourth library registration processes the same processes from step S101 to step S108 in FIG. 3B. Then, in order to re-design the layout, the process goes back to step S12. In order to re-process the OPC process, the process goes back to step S15. In order to re-verifies, the process goes back to step S18. In order to re-manufacture the masks, the process goes back to step S21. When the pattern is determined to be a proper OPC pattern, the process proceeds to step S154 or step S157.

(d) In Step S154, the film below the photo-resist film is etched by reactive ion etching (RIE) using the photo-resist film as an etching mask. The semiconductor wafer (Si substrate) may be etched by generating an oxide film ($SiO_2$ film) on the semiconductor wafer, etching the oxide film, removing the resist film, and etching the semiconductor substrate using the oxide film as an etching mask. After etching, the process proceeds to the etching inspection in step S155.

(e) In step S155, the etching inspection unit 38 checks the etched pattern. When the etched pattern is a proper OPC pattern, the process proceeds to step S158 to determines whether to finish lithography process. When the etched pattern is an improper OPC pattern, the fifth library registration is performed. As the fourth library registration process, the fifth library registration processes from step S101 through step S108 in FIG. 3B. Then, in order to re-design the layout, the process goes back to step S12. In order to re-process the OPC process, the process goes back to step S15. In order to re-verifies, the process goes back to step S18. In order to re-manufacture the masks, the process goes back to step S21.

(f) In step S158, it is verified whether all of the lithography processes are finished or not. When the lithography processes are finished, end lithography process (S23). When the lithography processes are not finished, and then the process goes back to step S150 through step S157. In this embodiment, any of step S143 in FIG. 3F and step S152 and S154 in FIG. 3G may be omitted.

In the OPC verification method according to an embodiment of the present invention, the verification turn around time (TAT) may be improved by storing improper OPC patterns in the library storage medium 41 in advance, conducting pattern matching between the stored improper OPC patterns and the patterns to be evaluated, and thus eliminating necessary simulation.

In the OPC verification method according to an embodiment of the present invention, the OPC time may be reduced. Namely, the process is simplified and repeated OPC processing is eliminated, by extracting and storing the improper OPC patterns in the library storage medium in advance, and applying OPC settings stored in the library storage medium to the pattern which is to be matched to one of the improper OPC patterns stored in the library storage medium. In addition, the most suitable OPC rule or model may be applied to every improper OPC pattern.

Furthermore, in the OPC verification method according to an embodiment of the present invention, the OPC setting is checked as to the risk of side effects, before storing the improper OPC patterns and their corresponding OPC settings in the library storage medium, and only such settings that are free from side effects are stored. Therefore, the risk of side effects may be minimized while improving the accuracy of the OPC processing.

In addition, in the conventional method, the OPC verification is necessary for detailed simulation of the transferred image after the OPC in order to verify the improper OPC pattern in the layout design step. However, in the OPC verification method according to an embodiment of the present invention, the OPC is conducted on the improper OPC pattern in advance, and the improper OPC patterns are stored in the library storage medium 41 after detailed simulation of the transferred image in the OPC verification. In the actual layout design step, pattern matching is conducted between the test pattern and the improper OPC patterns stored in the library storage medium 41 so that the matched pattern may be verified immediately, and the corrective treatment may be applied to correct the errors.

Corrective Treatment

There are many errors that cause a layout pattern to be an improper OPC pattern and there are many ways to correct these errors to make the improper OPC pattern to be a proper OPC pattern. In this section, examples of the corrective treatments are described. However, the corrective treatment may not be limited to the description in this application.

Figure 9A:
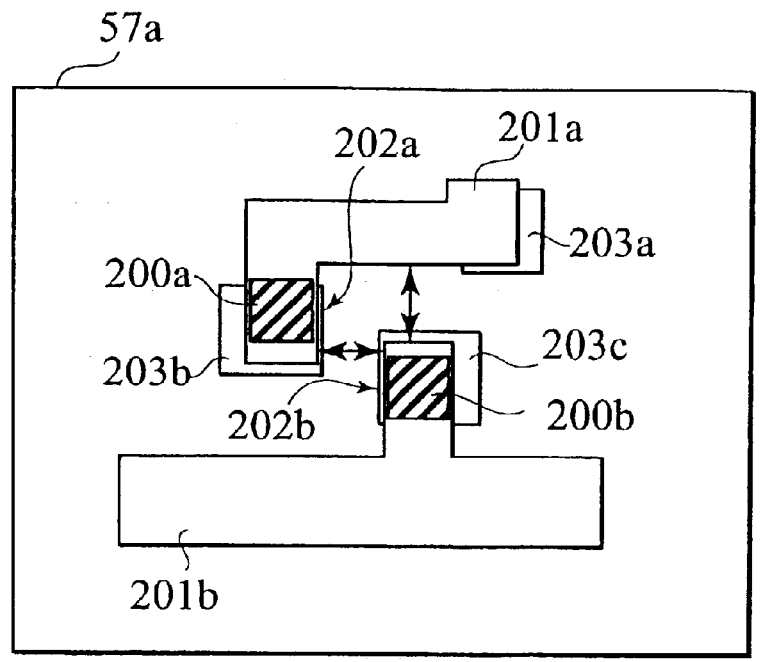
FIG. 9A is a diagram illustrating exemplary improper OPC pattern.

A pattern 201a and pattern 201b forms an improper OPC pattern 57a as shown in FIG. 9A. The pattern 201a has a via hole 200a, and an OPC correction 203b is proceeded around the pattern 201a where the via hole 200a is placed. In addition, another OPC correction 203a is proceeded at another end of the pattern 201a. The pattern 201b also has a via hole 200b, and an OPC correction 203c is proceeded around the pattern 201b where the via hole is placed. As shown in FIG. 9A, the space between the pattern 201a and the pattern 201b is not enough, a line shortening failure may occur at error points 202a and 202b.

Figure 9B:
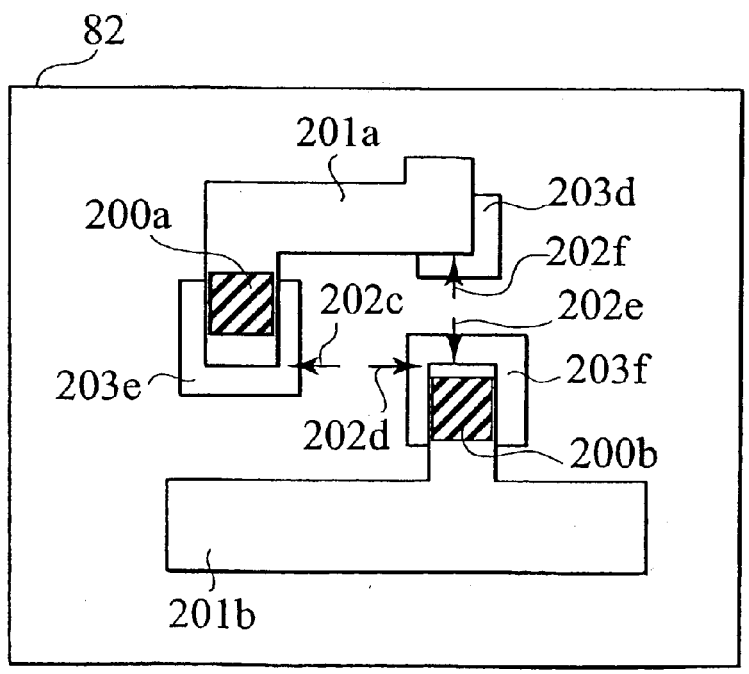
FIG. 9B is a diagram illustrating a proper OPC pattern after the corrective treatment is applied to the improper OPC pattern in FIG. 9A.

One corrective treatment to correct this improper OPC pattern 57a is shown in FIG. 9B. When the pattern 201a and the pattern 201b are separated in both way of arrows 202f and 202e (a longitudinal direction) and arrows 202c and 202d (a lateral direction), the patterns 201a and 201b have enough space to apply OPC corrections 203e and 203f to the patterns around the via holes 200a and 200b. In addition, an OPC correction 203d may also have enough space to correct the pattern 201a when the pattern 201a and the pattern 201b have enough space between each other.

Figure 9C:
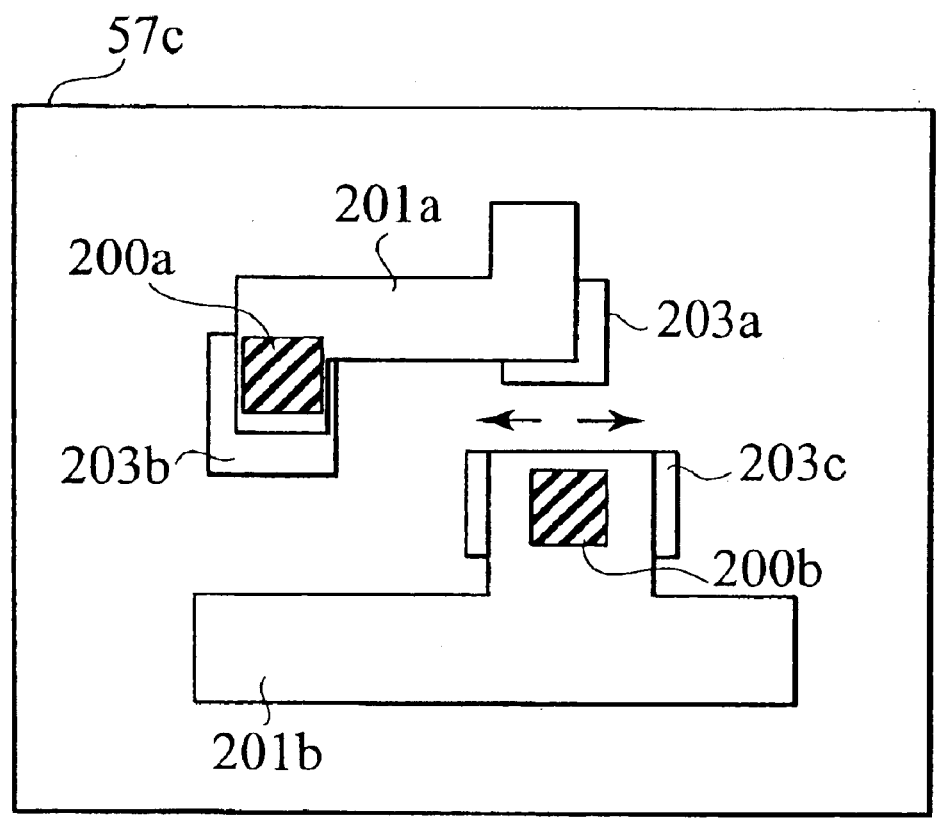
FIG. 9C is a diagram illustrating a proper OPC pattern after another corrective treatment is applied to the improper OPC pattern in FIG. 9A.

Another corrective treatment to correct this improper OPC pattern 57a is shown in FIG. 9C. When the pattern 201b has an enough space between via 200b and the pattern 201b, a pattern 75c may be a proper OPC pattern since the via 200b has enough space around itself, an OPC correction 203c may be appropriately applied to the pattern 201b, and the OPC correction 203a may also be appropriately applied to the pattern 201a.

Figure 9D:
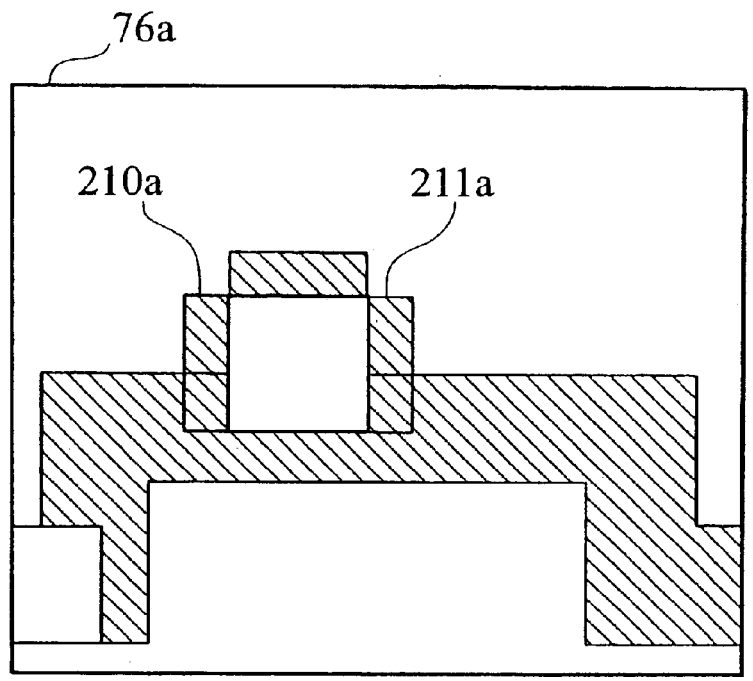
FIG. 9D is a diagram illustrating an improper OPC pattern with a bump.
Figure 9E:
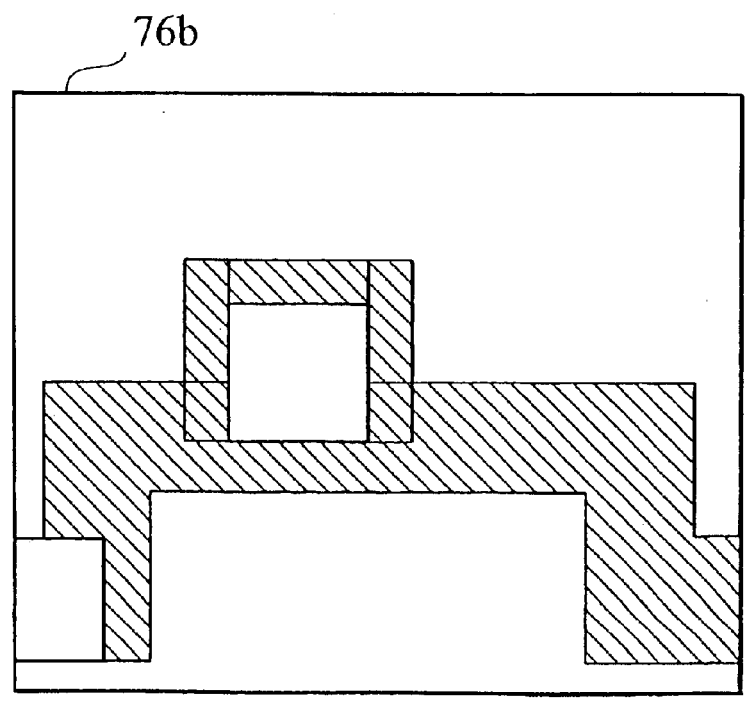
FIG. 9E is a diagram illustrating a proper OPC pattern after a corrective treatment.

As shown in FIG. 9D, the pattern 76a is an improper OPC pattern because of bumps 210a and 211a. The corrective treatment for the pattern 76a is to reduce the bumps 210a and 211a from the pattern 76a as shown in FIG. 9E. The pattern 76b, which does not have any bumps 210a and 211a, may become a proper OPC pattern.

Figure 9F:
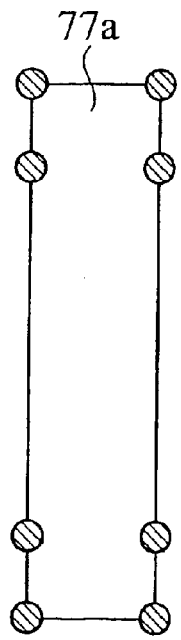
Figure 9G:
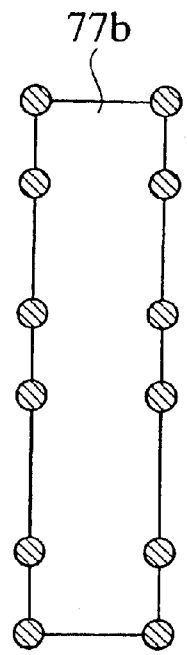

Another example of the corrective treatment is explained with reference to FIG. 9F and FIG. 9G. A pattern 77a has a problematic OPC setting, an edge dividing method. In the edge dividing method, a pattern is corrected for each divided edges. However, the division of the edge is not appropriate, the correction may not be accurate, and errors and problems may occur in this pattern. In order to solve the problem of the pattern 77a, edges of a pattern 77b, as shown in FIG. 9G, are divided into 12 parts, and the OPC correction may be applied to each 12 divided edges in order to apply an accurate corrective treatment for the pattern 77b.

The function of the OPC system of the first and second embodiment of the present invention may be programmed and saved in a computer-readable recording medium. For the OPC method of the first and second embodiment of the present invention, the programs saved in the recording medium is transferred to a memory in a computer system and then operated by its operating unit, thus putting the method in practice. The recording medium may be selected from semiconductor memories, magnetic disks, optical disks, optomagnetic disks, magnetic tapes, and any of the computer-readable recording mediums.

OTHER EMBODIMENTS

Although the embodiments of the present invention have been described in detail, the invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A computer implemented method for OPC comprising:
storing improper OPC patterns and corrective treatments for the improper OPC patterns in a library storage medium, wherein the improper OPC patterns are erroneous OPC test patterns;
reading a layout pattern; and
performing a pattern matching between a layout pattern and one of the improper OPC patterns stored in the library storage medium.

2. The method of claim 1, wherein the corrective treatments comprise a problem description, an improvement description and a prevention description to provide a proper OPC pattern.

3. The method of claim 1, further comprising extracting one of the corrective treatments for a matched improper OPC pattern and correcting the matched pattern by applying one of the corrective treatments.

4. The method of claim 1, further comprising:
performing a pattern matching between all patterns of hazardous points stored in a hazardous points storage medium; and the improper OPC pattern stored in the library storage medium; and
outputting lithography image when the patterns of the hazardous points do not match the improper OPC patterns.

5. The method of claim 1, further comprising:
checking a photo mask produced in a mask production process;
extracting a pattern which is determined to be one of the improper OPC patterns in the checking step; and
storing the extracted improper OPC pattern in the library storage medium.

6. The method of claim 5, further comprising:
exposing a pattern in photoresist film on a wafer by using the photo mask;
checking the exposed pattern;
extracting a pattern which is determined to be one of the improper OPC patterns in the checking step; and
storing the extracted improper OPC pattern in the library storage medium.

7. The method of claim 6, further comprising:
etching a thin layer under the photoresist film by using the photoresist film as an etching mask;
checking a pattern generated on a wafer;
extracting a pattern which is determined to be one of the improper OPC patterns in the checking step; and
storing the extracted improper OPC pattern in the library storage medium.

8. A system for OPC comprising:
a library storage medium;
a library registration unit configured to store an improper OPC patterns and corrective treatments for the improper OPC patterns in the library storage medium, wherein the improper OPC patterns are erroneous OPC test patterns and include at least one of patterns not applicable to OPC model calibration, patterns determined to have a problem in OPC based on process generation, dense or rarely-found patterns, and patterns determined to have a problem by wafer verification; and
a pattern matching unit configured to perform a pattern matching between a layout pattern and the improper OPC pattern stored in the library storage medium.

9. The system of claim 8, wherein the corrective treatments comprise a problem description, an improvement description and prevention description of the improper OPC patterns to provide a proper OPC pattern.

10. The system of claim 8, further comprising:
a layout unit configured to correct a matched pattern and provide a corrected layout pattern;
an OPC unit configured to correct a matched pattern and perform an OPC procedure to a corrected pattern; and
an OPC verification unit configured to correct a matched pattern and verify a result of the OPC procedure.

11. The system of claim 8, wherein the library registration unit comprises:
a data acquisition unit configured to acquire layout data;
an error point determination unit configured to extract an error pattern from the layout data;

a pattern variation analysis unit configured to generate a variation pattern of the error pattern and analyze whether the variation pattern includes defects;

a pattern variation extraction unit configured to extract a variation pattern including defects as an error pattern;

an action analysis unit configured to analyze a corrective treatment to correct the variation pattern including defects;

a data storing unit configured to store the error pattern, the variation pattern and the corrective treatment in the library storage medium.

12. The system of claim 8, further comprising a layout storage medium which stores the layout data;

wherein the layout storage medium;
a design unit configured to design layout design,
a layout registration unit configured to store the layout data in the layout storage medium.

13. The system of claim 10, further comprising a corrected layout storage medium which stores the corrected layout data;

wherein the OPC unit comprises:
a correcting unit configured to extract the improper OPC patterns, extract one of the corrective treatment corresponding to one of the improper OPC patterns, and correct the proper OPC pattern by applying the corrective treatment; and
a corrected data registration unit configured to store corrected layout data in the corrected data storage medium.

14. The system of claim 8, wherein the OPC verification unit comprises a lithography image output unit configures to perform a pattern matching between the layout pattern and the improper OPC pattern stored in the library storage medium and output lithography image when the pattern does not match the improper OPC patterns.

15. The system of claim 8, further comprising a pattern check unit configured to check the layout pattern wherein the pattern check unit comprises:

a mask check unit configured to check a photo mask;
photoresist-pattern check unit configured to check an exposed pattern on a wafer; and
an etching check unit configured to check an etched pattern generated on a wafer.

16. A computer program product for use with an optical proximity correction system, the system comprises a CPU and a library storage medium connected to the CPU, the computer program product comprising:

instructions configured to store improper OPC patterns and corrective treatments for the improper OPC patterns in a library storage medium, wherein the improper OPC patterns are erroneous OPC test patterns and include at least one of patterns not applicable to OPC model calibration, patterns determined to have a problem in OPC based on process generation, dense or rarely-found patterns, and patterns determined to have a problem by wafer verification;

instructions configured to read a layout pattern; and
instructions configured to perform a pattern matching between a layout pattern and one of the improper OPC patterns stored in the library storage medium.

17. The computer program product of claim 16, wherein the corrective treatments comprise a problem description, an improvement description and a prevention description to provide a proper OPC pattern.

18. The computer program product of claim 16, further comprising:

instructions configured to extract one of the corrective treatment for a matched improper OPC pattern and correcting the matched pattern by applying one of the corrective treatments.

19. The computer program product of claim 16, further comprising:

instruction configured to perform pattern matchings between all pattern of hazardous points, stored in hazardous points storage medium and the improper OPC pattern stored in the library storage medium; and
instruction configured to output lithography image when the patterns of the hazardous points do not match the improper OPC patterns.

20. The computer program product of claim 16, further comprising:

instruction configured to check a photo mask produced in a mask production process;
instructions configured to extract a pattern which is determined to be one of the improper OPC patterns in the checking step;
instructions configured to store the extracted improper OPC pattern in the library storage medium;
instructions configured to expose a pattern to photoresist film on a wafer by using the photo mask;
instructions configured to check the exposed pattern; instructions configured to extract a pattern which is determined to be one of the improper OPC patterns in the checking step;
instructions configured to store the extracted improper OPC pattern in the library storage medium;
instructions configured to etch a thin layer under the photoresist film by using the photoresist film as an etching mask;
instructions configured to check a pattern generated on a wafer;
instructions configured to extract a pattern which is determined in be an improper OPC pattern in the checking step; and
instructions configured to store the extracted improper OPC pattern in the library storage medium.

* * * * *